United States Patent
Tsuda et al.

(10) Patent No.: US 11,477,883 B2
(45) Date of Patent: Oct. 18, 2022

(54) METAL-CLAD LAMINATE, METAL FOIL WITH RESIN, AND WIRING BOARD

(71) Applicant: PANASONIC INTELLECTUAL PROPERTY MANAGEMENT CO., LTD., Osaka (JP)

(72) Inventors: Kosuke Tsuda, Osaka (JP); Hirosuke Saito, Osaka (JP); Hiroaki Fujiwara, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 54 days.

(21) Appl. No.: 16/629,811

(22) PCT Filed: Jun. 22, 2018

(86) PCT No.: PCT/JP2018/023809
§ 371 (c)(1),
(2) Date: Jan. 9, 2020

(87) PCT Pub. No.: WO2019/012953
PCT Pub. Date: Jan. 17, 2019

(65) Prior Publication Data
US 2021/0084757 A1 Mar. 18, 2021

(30) Foreign Application Priority Data
Jul. 12, 2017 (JP) .............................. JP2017-136218

(51) Int. Cl.
*H05K 1/03* (2006.01)
*B32B 15/08* (2006.01)
(Continued)

(52) U.S. Cl.
CPC ............ *H05K 1/0353* (2013.01); *B32B 5/024* (2013.01); *B32B 15/06* (2013.01); *B32B 15/08* (2013.01);
(Continued)

(58) Field of Classification Search
CPC ...... H05K 1/0353; H05K 1/09; H05K 1/0326; H05K 3/022; H05K 2201/0209;
(Continued)

(56) References Cited

U.S. PATENT DOCUMENTS

2005/0121229 A1 6/2005 Takai et al.
2008/0011612 A1 1/2008 Takai et al.
(Continued)

FOREIGN PATENT DOCUMENTS

CN 106211545 12/2016
JP 2004-025835 1/2004
(Continued)

OTHER PUBLICATIONS

Official Communication issued in International Patent Application No. PCT/JP2018/023809, dated Sep. 25, 2018, along with an English translation thereof.

*Primary Examiner* — Callie E Shosho
*Assistant Examiner* — Bethany M Miller
(74) *Attorney, Agent, or Firm* — Greenblum & Bernstein, P.L.C.

(57) ABSTRACT

A metal-clad laminate includes: an insulating layer; and a metal foil being in contact with at least one surface of the insulating layer. The insulating layer contains a cured product of a resin composition containing a polyphenylene ether copolymer having an intrinsic viscosity of 0.03 to 0.12 dl/g measured in methylene chloride at 25° C. and having an average of 1.5 to 3 specific groups per molecule at its molecular terminal, a thermosetting curing agent having two
(Continued)

or more carbon-carbon unsaturated double bonds at its molecular terminal, and a thermoplastic elastomer. The metal foil includes a metal substrate, and a cobalt-containing barrier layer provided on at least a contact surface of the metal substrate, the contact surface being in contact with the insulating layer. The contact surface has a ten-point average roughness Rz of 2 μm or less as a surface roughness.

11 Claims, 3 Drawing Sheets

(51) Int. Cl.
   *B32B 15/06* (2006.01)
   *B32B 15/20* (2006.01)
   *B32B 5/02* (2006.01)
   *H05K 1/09* (2006.01)

(52) U.S. Cl.
   CPC ............... *B32B 15/20* (2013.01); *H05K 1/09* (2013.01); *B32B 2260/021* (2013.01); *B32B 2260/046* (2013.01); *B32B 2457/08* (2013.01)

(58) Field of Classification Search
   CPC ...... H05K 3/389; H05K 3/388; H05K 1/0373; H05K 1/0366; B32B 5/024; B32B 15/06; B32B 15/08; B32B 15/20; B32B 2260/021; B32B 2260/046; B32B 2457/08; B32B 15/12; B32B 5/022; B32B 5/26; B32B 29/005; B32B 15/14; B32B 2307/748; B32B 2250/40; B32B 2307/54; B32B 2307/732; B32B 2255/205; B32B 2262/0276; B32B 2307/204; B32B 2262/0269; B32B 2307/206; B32B 2307/538; B32B 2255/06; B32B 2262/101; C08F 290/06
   See application file for complete search history.

(56) References Cited

U.S. PATENT DOCUMENTS

| | | |
|---|---|---|
| 2008/0277143 A1 | 11/2008 | Takai et al. |
| 2009/0032287 A1 | 2/2009 | Takai et al. |
| 2016/0168378 A1 | 6/2016 | Umehara et al. |
| 2016/0289446 A1* | 10/2016 | Endo .................. C08K 5/14 |
| 2016/0353567 A1 | 12/2016 | Ichiryu et al. |

FOREIGN PATENT DOCUMENTS

| | | |
|---|---|---|
| JP | 2011-001473 | 1/2011 |
| JP | 2016-113543 | 6/2016 |

* cited by examiner

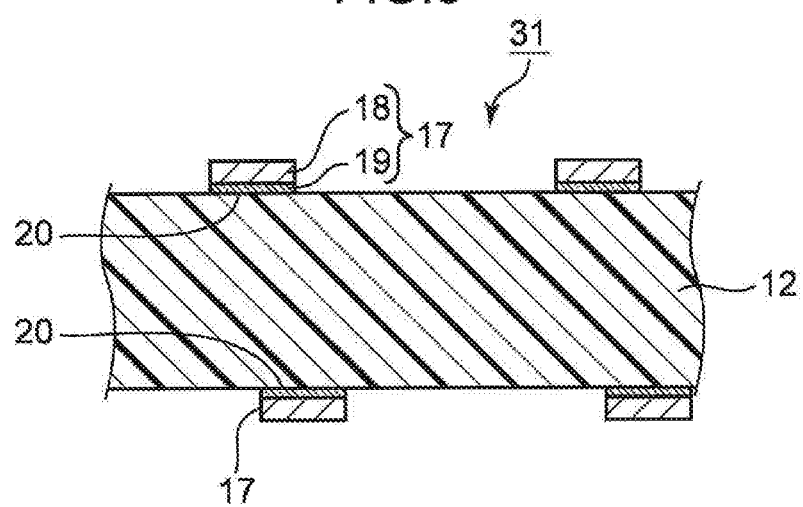

METAL-CLAD LAMINATE, METAL FOIL WITH RESIN, AND WIRING BOARD

TECHNICAL FIELD

The present invention relates to a metal-clad laminate, a metal foil with resin, and a wiring board.

BACKGROUND ART

Along with an increase in amount of information to be processed, mounting techniques involving high integration of a semiconductor device to be incorporated, high density of wiring, making multilayer, and the like rapidly develop in various electronic devices. A wiring board compatible with high-frequency waves such as a millimeter-wave radar substrate for in-vehicle use is required in the various electronic devices.

When a signal is transmitted to wiring provided in a wiring board, a transmission loss occurs due to a conductor that forms the wiring and due to a dielectric body around the wiring. The wiring board is required to have a reduced loss during signal transmission in order to increase a signal transmission speed. The transmission loss has been known to be particularly apt to occur when a high-frequency signal is transmitted to wiring provided in a wiring board. For this reason, the wiring board compatible with high-frequency waves is further required to reduce the transmission loss. In order to satisfy this requirement, a material having a low dielectric constant and a low dielectric tangent is considered to be used as an insulating layer in a wiring board.

Meanwhile, a metal-clad laminate and a metal foil with resin that are used to produce a wiring board and the like include not only an insulating layer but also a metal foil on the insulating layer. The wiring board also includes not only the insulating layer but also wiring on the insulating layer, such as wiring attributable to the metal foil. Examples of the metal-clad laminate and the metal foil with resin that focus on such a metal foil include those described in PTL 1.

PTL 1 discloses a metal-clad laminate and a metal foil with resin that include an insulating resin composition layer and a metal foil fixed to one surface or both the surfaces of the insulating resin composition layer. The metal foil is surface-treated at least on a side of the insulating resin composition layer, and is not substantially roughened on both surfaces.

PTL 1 discloses that it is possible to achieve both adhesiveness and flatness of an interface between the insulating resin composition layer and the metal foil and to also satisfy a practical element involving the production of a printed wiring board.

The wiring board is further required to reduce the loss during signal transmission in order to further increase the transmission speed of a signal. The wiring board is also required to have high reliability causing no peeling and the like of the wiring from the insulating layer even when the wiring board is heated or absorbs moisture. For this reason, the metal-clad laminate and the metal foil with resin are required to have a high adhesive force between the metal foil and the insulating layer, and to suppress a decrease in the adhesive force between the metal foil and the insulating layer due to heating and moisture absorption.

CITATION LIST

Patent Literature

PTL 1: Japanese Unexamined Patent Publication No. 2004-25835

SUMMARY OF INVENTION

In view of such circumstances, it is an object of the present invention to provide a metal-clad laminate, a metal foil with resin, and a wiring board that have a reduced loss during signal transmission, have a high adhesive force between a metal foil and an insulating layer, and sufficiently suppress a decrease in the adhesive force between the metal foil and the insulating layer due to heating and moisture absorption.

One aspect of the present invention is a metal-clad laminate comprising: an insulating layer; and a metal foil being in contact with at least one surface of the insulating layer, wherein: the insulating layer contains a cured product of a resin composition containing a polyphenylene ether copolymer having an intrinsic viscosity of 0.03 to 0.12 dl/g measured in methylene chloride at 25° C. and having an average of 1.5 to 3 groups represented by the following formula (1) or (2) per molecule at its molecular terminal, a thermosetting curing agent having two or more carbon-carbon unsaturated double bonds at its molecular terminal, and a thermoplastic elastomer; the metal foil includes a metal substrate, and a cobalt-containing barrier layer provided on at least a contact surface of the metal substrate, the contact surface being in contact with the insulating layer; and the contact surface has a ten-point average roughness Rz of 2 μm or less as a surface roughness.

[Chemical Formula 1]

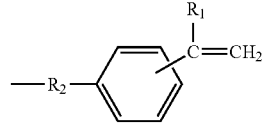

(1)

In the formula (1), $R_1$ represents a hydrogen atom or an alkyl group having 1 to 10 carbon atoms, and $R_2$ represents an alkylene group having 1 to 10 carbon atoms.

[Chemical Formula 2]

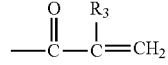

(2)

In the formula (2), $R_3$ represents a hydrogen atom or an alkyl group having 1 to 10 carbon atoms.

Another aspect of the present invention is a metal foil with resin comprising: an insulating adhesive layer; and a metal foil being in contact with at least one surface of the insulating adhesive layer, wherein: the insulating adhesive layer contains a resin composition or a semi-cured product of the resin composition, the resin composition containing a polyphenylene ether copolymer having an intrinsic viscosity of 0.03 to 0.12 dl/g measured in methylene chloride at 25° C. and having an average of 1.5 to 3 groups represented by the above formula (1) or (2) per molecule at its molecular terminal, a thermosetting curing agent having two or more carbon-carbon unsaturated double bonds at its molecular terminal, and a thermoplastic elastomer; the metal foil includes a metal substrate, and a cobalt-containing barrier layer provided on at least a contact surface of the metal substrate, the contact surface being in contact with the insulating adhesive layer; and the contact surface has a ten-point average roughness Rz of 2 μm or less as a surface roughness.

Still another aspect of the present invention is a wiring board comprising: an insulating layer; and wiring being in contact with at least one surface of the insulating layer, wherein: the insulating layer contains a cured product of a resin composition containing a polyphenylene ether copolymer having an intrinsic viscosity of 0.03 to 0.12 dl/g measured in methylene chloride at 25° C. and having an average of 1.5 to 3 groups represented by the above formula (1) or (2) per molecule at its molecular terminal, a thermosetting curing agent having two or more carbon-carbon unsaturated double bonds at its molecular terminal, and a thermoplastic elastomer; the metal foil wiring includes a metal substrate, and a cobalt-containing barrier layer provided on at least a contact surface of the metal substrate, the contact surface being in contact with the insulating layer; and the contact surface has a ten-point average roughness Rz of 2 μm or less as a surface roughness.

The above and other objects, features and advantages of the present invention will be apparent from the following detailed description.

BRIEF DESCRIPTION OF DRAWINGS

FIG. 3 is a cross-sectional view showing a configuration of a wiring board according to still another embodiment of the present invention.

DESCRIPTION OF EMBODIMENTS

Figure 1:
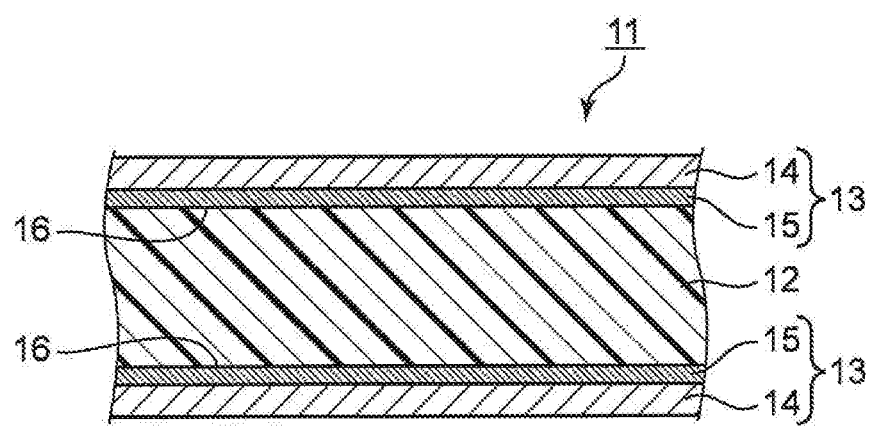
FIG. 1 is a cross-sectional view showing a configuration of a metal-clad laminate according to an embodiment of the present invention.

The present inventors have focused on wiring formed on an insulating layer in order to reduce a loss in a wiring board during signal transmission.

Specifically, first, the present inventors have inferred that high-frequency signals transmitted through wiring concentrate around a surface of a conductor constituting the wiring due to a skin effect. Meanwhile, in a metal-clad laminate and a metal foil with resin, it is known that roughening is generally performed on a surface (contact surface) of a metal foil that is in contact with an insulating layer in order to increase adhesive strength between the metal foil and the insulating layer. In the case of a wiring board, it is known that wiring having a roughened contact surface is used in order to increase adhesive strength between the wiring and an insulating layer. Even under these circumstances, the present inventors have studied reduction of surface roughness of the metal foil or the wiring. The present inventors have considered that the reduction of surface roughness makes the surface of the wiring flat and smooth to shorten the transmission distance of a signal that flows around the surface of the wiring. That is, the present inventors have found that it is possible to reduce the loss during signal transmission, even without changing the composition and the like of the insulating layer of the wiring board, by increasing the flatness and smoothness of the surface of the wiring that is in contact with the insulating layer, the wiring being provided on the insulating layer of the wiring board.

Furthermore, as the metal foil used in the metal-clad laminate and the metal foil with resin, a metal foil is generally plated with nickel having high heat resistance. PTL 1 also reports that the surface of a metal foil is mainly subjected to rust-proofing using nickel. As described above, the present inventors have studied the use of cobalt having lower electrical resistance than that of nickel, for a barrier layer provided on the surface of the metal foil or the wiring because signals are considered to as described above concentrate around the surface of a conductor constituting the wiring.

Meanwhile, cobalt has lower heat resistance than that of nickel. Therefore, the present inventors have studied the use of an insulating layer containing a cured product obtained by curing a resin composition having excellent heat resistance. The present inventors have considered that the heat resistance of a metal-clad laminate or a metal foil with resin to be obtained can be sufficiently maintained even when the metal foil that includes the cobalt-containing barrier layer having lower heat resistance than that of nickel is used, because the insulating layer in contact with the metal foil has high heat resistance. The present inventors have also considered that the obtained insulating layer has excellent dielectric properties because the cured product contained in the insulating layer contains a component attributable to polyphenyl ether that has a low dielectric constant and a low dielectric tangent. Accordingly, the present inventors have considered that the metal-clad laminate and the metal foil with resin including such an insulating layer can improve heat resistance and further reduce the loss during signal transmission.

Furthermore, as a result of the studies provided by the present inventors, after heating or moisture absorption of the obtained wiring board, the adhesive strength between the wiring and the insulating layer is decreased depending on the cured product contained in the insulating layer. In some cases, the wiring is peeled. Therefore, the present inventors have found that, with use of the following cured product of a resin composition containing a thermoplastic elastomer as the cured product contained in the insulating layer, an adhesive force between the metal foil and the insulating layer can be increased, and a decrease in the adhesive force between the metal foil and the insulating layer due to heating and moisture absorption can be suppressed.

As a result of various studies as described above, the present inventors have found that the object of providing a metal-clad laminate, a metal foil with resin, and a wiring board that have a reduced loss during signal transmission, have a high adhesive force between a metal foil and an insulating layer, and sufficiently suppress a decrease in the adhesive force between the metal foil and the insulating layer due to heating and moisture absorption is achieved by the following present invention, and have completed the present invention described later.

Hereinafter, embodiments according to the present invention will be described, but the present invention is not limited thereto.

A metal-clad laminate according to an embodiment of the present invention includes an insulating layer and a metal foil being in contact with at least one surface of the insulating layer. As shown in FIG. 1, a metal-clad laminate 11 includes an insulating layer 12 and a metal foil 13 disposed so as to be in contact with each of both the surfaces of the insulating layer 12. In the metal-clad laminate, the metal foil may be provided so as to be in contact with only one surface of the insulating layer. FIG. 1 is a cross-sectional view showing the configuration of the metal-clad laminate 11 according to the present embodiment.

The insulating layer 12 contains a cured product of a resin composition containing a polyphenylene ether copolymer having an intrinsic viscosity of 0.03 to 0.12 dl/g measured in methylene chloride at 25° C. and having an average of 1.5 to 3 groups represented by the following formula (1) or (2) per molecule at its molecular terminal, a thermosetting curing agent having two or more carbon-carbon unsaturated double bonds at its molecular terminal, and a thermoplastic elastomer.

[Chemical Formula 3]

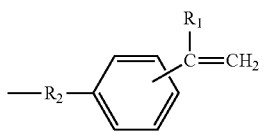

(1)

In the formula (1), $R_1$ represents a hydrogen atom or an alkyl group having 1 to 10 carbon atoms, and $R_2$ represents an alkylene group having 1 to 10 carbon atoms.

[Chemical Formula 4]

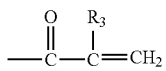

(2)

In the formula (2), $R_3$ represents a hydrogen atom or an alkyl group having 1 to 10 carbon atoms.

The insulating layer 12 is not particularly limited as long as it contains the cured product of the resin composition. The insulating layer 12 may be, for example, a layer composed of only the cured product of the resin composition, or may be a layer containing not only the cured product of the resin composition but also a fibrous substrate. The insulating layer 12 includes the fibrous substrate, whereby the insulating layer 12 can have improved strength and heat resistance and the like. Specific examples of the insulating layer containing the fibrous substrate include a layer obtained by impregnating the fibrous substrate with the resin composition and curing the resin composition with which the fibrous substrate is impregnated.

The insulating layer 12 includes the cured product of the resin composition. The resin composition contains the polyphenylene ether copolymer and the thermosetting curing agent. The polyphenylene ether copolymer has excellent dielectric properties, and reacts with the thermosetting curing agent to allow the polyphenylene ether copolymer to be cured, whereby the insulating layer 12 includes the cured product having excellent dielectric properties. The resin composition contains the thermoplastic elastomer, whereby the insulating layer 12 contains the thermoplastic elastomer. Due to the reason described above, as the insulating layer 12, there is obtained a layer that has a high adhesive force between the metal foil and the insulating layer, and suppresses a decrease in the adhesive force between the metal foil and the insulating layer due to heating and moisture absorption.

The metal foil 13 includes a metal substrate 14 and a barrier layer 15 provided on at least a contact surface 16 of the metal substrate 14, the contact surface 16 being in contact with the insulating layer 12. Examples of the metal foil 13, as shown in FIG. 1, include a metal foil including the metal substrate 14 and the barrier layer 15 provided on at least the contact surface 16 of the metal substrate 14, the contact surface 16 being in contact with the insulating layer 12. The metal foil may include the barrier layer provided on each of both the surfaces of the metal substrate. The contact surface 16 has a ten-point average roughness Rz of 2 μm or less as a surface roughness.

The metal foil 13 is in contact with the insulating layer 12. That is, the barrier layer 15 of the metal foil 13 is in contact with the insulating layer 12. When a wiring board is produced from the metal-clad laminate 11, the metal foil 13 serves as wiring of the wiring board. The metal foil 13 that can serve as wiring has a low surface roughness of the contact surface 16 with the insulating layer 12 as described above, so that the wiring also has a low surface roughness of the contact surface with the insulating layer. Due to the reason described above, the wiring board obtained from the metal-clad laminate 11 is considered to be high in flatness and smoothness of an interface between insulating layer and the wiring. This is considered to allow the wiring board to decrease a conductor loss generated by contact of the wiring with the insulating layer. Accordingly, the metal-clad laminate 11 is considered to provide a wiring board having a reduced loss during signal transmission.

Furthermore, the metal foil 13 includes, as described above, the cobalt-containing barrier layer 15 on the contact surface 16 side. This feature is also considered to be capable of reducing the loss during signal transmission. The cobalt-containing barrier layer 15 is considered to have excellent adhesiveness with the insulating layer 12. This is considered to make it possible to sufficiently secure the adhesiveness between the metal foil 13 and the insulating layer 12 even when the flatness and smoothness of the contact surface 16 of the metal foil 13 with the insulating layer 12 are improved. Accordingly, in the wiring board produced with use of the metal-clad laminate 11, it is possible to prevent the wiring from peeling from the insulating layer. This feature also makes it possible for the metal-clad laminate 11 to produce a suitable wiring board.

Due to the reasons described above, the obtained metal-clad laminate 11 is capable of suitably producing a wiring board having a reduced loss during signal transmission. The metal-clad laminate 11 is not only capable of suitably producing a wiring board having a reduced loss during signal transmission but also capable of having a high adhesive force between the metal foil and the insulating layer and sufficiently suppressing a decrease in the adhesive force between the metal foil and the insulating layer due to heating and moisture absorption. Due to the reason described above, the metal-clad laminate 11 has high reliability that is less likely to cause problems due to heating and the like, and can produce a highly reliable circuit board.

The contact surface 16 of the metal foil 13 has a surface roughness of 2 μm or less as described above, preferably 1.5 μm or less, and more preferably 1 μm or less. The contact surface 16 having a lower surface roughness, that is, the metal foil 13 having higher flatness and smoothness is, as described above, preferable in terms of being capable of reducing the loss during signal transmission. Meanwhile, even when the surface roughness of the contact surface 16 is decreased, a limit of the decrease is a ten-point average roughness Rz of about 0.5 μm. When the contact surface 16 has an excessively low surface roughness, the adhesiveness between the metal foil 13 and the insulating layer 12 tends to be decreased even if the cobalt-containing barrier layer is provided. Due to the reasons described above, the contact surface 16 preferably has, as a surface roughness, a ten-point average roughness Rz of 0.5 µm or more. Accordingly, the contact surface 16 has, as a surface roughness, a ten-point average roughness Rz of preferably 0.5 µm to 2 µm, more preferably 0.6 µm to 1.5 µm, and still preferably 0.6 µm to 1 µm. The metal foil 13 includes the metal substrate 14 and the cobalt-containing barrier layer 15 on the contact surface 16 side of the metal substrate 14, so that the surface roughness of the contact surface 16 is the surface roughness of the barrier layer 15. The surface roughness of the metal substrate 14 is not particularly limited. When the surface roughness of the metal foil 13 is not remarkably changed even if the barrier layer 15 is formed, the surface roughness of the metal substrate 14 is preferably equivalent to the surface roughness of the contact surface 16 (barrier layer 15).

The metal substrate 14 is not particularly limited as long as it can be used as the metal foil of the metal-clad laminate. Specific examples of the metal substrate 14 include a copper foil, a nickel foil, and an aluminum foil. Among these, a copper foil is preferably used as the metal substrate 14.

The barrier layer 15 is not particularly limited as long as it is a cobalt-containing layer. The barrier layer 15 necessarily contains cobalt. Although the barrier layer may contain a metal other than cobalt (another metal) without impairing the effects of the present invention, the barrier layer is preferably a layer made of cobalt. Examples of the other metal include nickel, tin, zinc, and chromium, but the barrier layer preferably contains neither nickel nor tin that has high electrical resistance. Examples of the barrier layer 15 include a layer formed by plating the metal substrate (metal foil before the barrier layer is provided) 14. Examples of this plating include sputtering, electrolytic plating, and non-electrolytic plating using cobalt or a cobalt-containing alloy. The metal substrate (metal foil before the barrier layer is provided) 14 such as a copper foil may be separately subjected to rust-proofing such as chromating in order to prevent surface oxidation, before formation of the above-described cobalt-containing barrier layer.

The thickness of the metal foil 13 is different according to performance required for the wiring board finally obtained, and is not particularly limited. The thickness of the metal foil 13 is preferably 12 to 70 µm, for example.

As the metal foil 13, commercially available metal foils can be used. Examples of the commercially available metal foils include a cobalt-plated copper foil manufactured by Fukuda Metal Foil & Powder Co., Ltd. More specific examples thereof include T9FZ-SV [Rz: 1.6 µm, thickness: 18 µm] and T9DA-SV [Rz: 1.0 µm, thickness: 18 µm] both manufactured by Fukuda Metal Foil & Powder Co., Ltd.

The cured product contained in the insulating layer 12 is obtained by curing the resin composition as described above. The resin composition contains the polyphenylene ether copolymer, the thermosetting curing agent, and the thermoplastic elastomer. Hereinafter, components contained in the resin composition will be described.

The polyphenylene ether copolymer used in the present embodiment has an intrinsic viscosity of 0.03 to 0.12 dl/g measured in methylene chloride at 25° C. and has an average of 1.5 to 3 groups represented by the formula (1) or (2) per molecule at its molecular terminal.

In the formula (1), $R_1$ is a hydrogen atom or an alkyl group having 1 to 10 carbons. The alkyl group having 1 to 10 carbon atoms is not particularly limited as long as it is an alkyl group having 1 to 10 carbon atoms, and may be linear or branched. Specific examples thereof include a methyl group, an ethyl group, a n-propyl group, an isopropyl group, a n-butyl group, an isobutyl group, a s-butyl group, a t-butyl group, a pentyl group, an isopentyl group, a neopentyl group, and a hexyl group. Among these, a hydrogen atom is preferable. $R_2$ represents an alkylene group having 1 to 10 carbon atoms. Examples of the alkylene group having 1 to 10 carbon atoms include a methylene group, an ethylene group, a propylene group, a butylene group, a pentylene group, a hexylene group, a heptylene group, an octylene group, a nonylene group, and a decylene group. Among these, a methylene group is preferable.

The group represented by the formula (1) is not particularly limited, but a p-ethenylbenzyl group and a m-ethenylbenzyl group are preferable.

In the formula (2), $R_3$ represents a hydrogen atom or an alkyl group having 1 to 10 carbon atoms. The alkyl group having 1 to 10 carbon atoms is not particularly limited as long as it is an alkyl group having 1 to 10 carbon atoms, and may be linear or branched. Specific examples thereof include the same alkyl group as the above $R_1$. $R_3$ is preferably a methyl group.

The group represented by the formula (2) is not particularly limited, but for example, an acrylate group and a methacrylate group are preferable.

As the group represented by the formula (1) or (2), the groups exemplified above may be used alone or in combination of two or more.

The polyphenylene ether copolymer preferably has the group represented by the formula (2). The use of such a polyphenylene ether copolymer provides a metal-clad laminate that further suppresses a decrease in the adhesive force between the metal foil and the insulating layer due to heating and moisture absorption.

The intrinsic viscosity of the polyphenylene ether copolymer used in the present embodiment is 0.03 to 0.12 dl/g, preferably 0.04 to 0.11 dl/g, and more preferably 0.06 to 0.095 dl/g. If the intrinsic viscosity is too low, the molecular weight tends to be low and low dielectric properties such as a low dielectric constant and a low dielectric tangent tend to be less likely to be obtained. If the intrinsic viscosity is too high, the viscosity is high, and sufficient flow properties are not obtained, which tends to cause deteriorated moldability of the cured product. Accordingly, if the intrinsic viscosity of the polyphenylene ether copolymer falls within the above range, excellent heat resistance and moldability of the cured product can be achieved.

Here, "intrinsic viscosity" refers to the intrinsic viscosity measured in methylene chloride at 25° C. More specifically, this is a value obtained by measuring, for example, a 0.18 g/45 mL methylene chloride solution (liquid temperature: 25° C.) with a viscometer. Examples of the viscometer include AVS500 Visco System manufactured by Schott Instruments GmbH.

In the polyphenylene ether copolymer used in the present embodiment, the average number of groups represented by the formula (1) or (2) (number of terminal functional groups) per molecule of the polyphenylene ether copolymer at its molecular terminal is 1.5 to 3, and preferably 1.5 to 2. If the number of such terminal functional groups is too small, cured products having sufficient heat resistance tend to be less likely to be obtained. If the number of terminal functional groups is too large, the reactivity becomes excessively high, which may cause problems such as deterioration in the storability of the resin composition or deterioration in the flow properties of the resin composition, for example. That is, when such a polyphenylene ether copolymer is used, insufficient flow properties and the like cause molding defects such as void formation during multilayer molding, which may cause a moldability problem that makes it difficult to obtain a wiring board having high reliability.

The number of the terminal functional groups of the polyphenylene ether copolymer is exemplified by a numerical number that expresses the average number of groups represented by the formula (1) or (2) per molecule of all the polyphenylene ether copolymers present in a mole of the polyphenylene ether copolymer. This number of terminal functional groups can be measured by, for example, measuring the number of hydroxyl groups remaining in the obtained polyphenylene ether copolymer and calculating the amount of decrease from the number of hydroxyl groups of the polyphenylene ether prior to modification (before the group represented by the formula (1) or (2) is bonded). The amount of decrease from the number of hydroxyl groups of the polyphenylene ether prior to modification is the number of terminal functional groups. The number of hydroxyl groups remaining in the polyphenylene ether copolymer can be obtained by adding, to a solution of the polyphenylene ether copolymer, a quaternary ammonium salt (tetraethylammonium hydroxide) that associates with hydroxyl groups and measuring the UV absorbance of the mixed solution.

The polyphenylene ether copolymer according to the present embodiment has polyphenylene ether chains in its molecule. For example, the polyphenylene ether copolymer preferably has repeating units represented by the following formula (3) in its molecule.

[Chemical Formula 5]

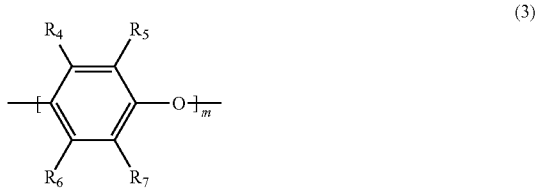

(3)

In the formula (3), "m" represents 1 to 50. $R_4$ to $R_7$ are each independent. That is, $R_4$ to $R_7$ may each be the same group or different groups. $R_4$ to $R_7$ each represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

The functional groups mentioned in $R_4$ to $R_7$ are specifically exemplified as follows.

The alkyl group is not particularly limited, but, for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group.

The alkenyl group is not particularly limited, but, for example, an alkenyl group having 2 to 18 carbon atoms is preferable, and an alkenyl group having 2 to 10 carbon atoms is more preferable. Specific examples thereof include a vinyl group, an allyl group, and a 3-butenyl group.

The alkynyl group is not particularly limited, but, for example, an alkynyl group having 2 to 18 carbon atoms is preferable, and an alkynyl group having 2 to 10 carbon atoms is more preferable. Specific examples thereof include an ethynyl group and a prop-2-yn-1-yl (propargyl) group.

The alkylcarbonyl group is not particularly limited as long as it is a carbonyl group substituted with an alkyl group, but, for example, an alkylcarbonyl group having 2 to 18 carbon atoms is preferable, and an alkylcarbonyl group having 2 to 10 carbon atoms is more preferable. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group, but, for example, an alkenylcarbonyl group having 3 to 18 carbon atoms is preferable, and an alkenylcarbonyl group having 3 to 10 carbon atoms is more preferable. Specific examples thereof include an acryloyl group, a methacryloyl group, and a crotonoyl group.

The alkynyl carbonyl group is not particularly limited as long as it is a carbonyl group substituted with an alkynyl group, but, for example, an alkynyl carbonyl group having 3 to 18 carbon atoms is preferable, and an alkynyl carbonyl group having 3 to 10 carbon atoms is more preferable. Specific examples thereof include a propioloyl group.

Examples of the polyphenylene ether copolymer used in the present embodiment include polyphenylene ether copolymers having a group represented by the formula (1) or (2) at a terminal of a polyphenylene ether represented by any of the following formulae (4), (6), and (7). Specific examples of the polyphenylene ether copolymer include modified polyphenylene ethers represented by the following formulae (8) to (13).

[Chemical Formula 6]

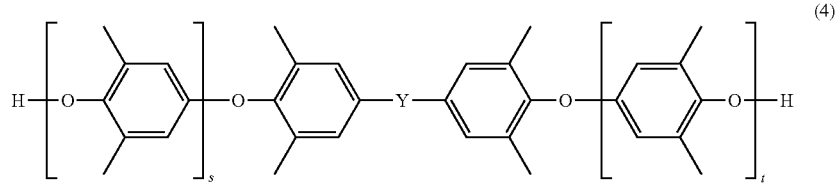

(4)

In the formula (4), the total value of "s" and "t" is preferably 1 to 30, for example. "s" is preferably 0 to 20, and "t" is preferably 0 to 20. That is, it is preferable that "s" represents 0 to 20, "t" represents 0 to 20, and the sum of "s" and "t" represents 1 to 30. "Y" represents a linear, branched or cyclic hydrocarbon group. Examples of "Y" include a group represented by the following formula (5).

[Chemical Formula 7]

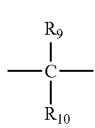
(5)

In the formula (5), $R_9$ and $R_{10}$ each independently represent a hydrogen atom or an alkyl group. Examples of the alkyl group include a methyl group. Examples of the group represented by the formula (5) include a methylene group, a methylmethylene group, and a dimethylmethylene group.

[Chemical Formula 8]

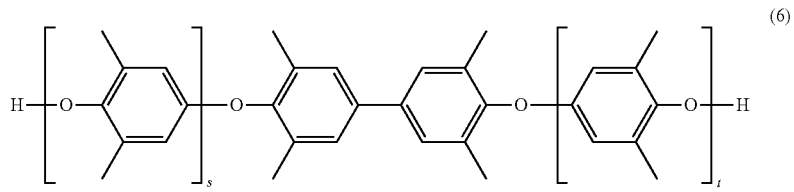
(6)

[Chemical Formula 9]

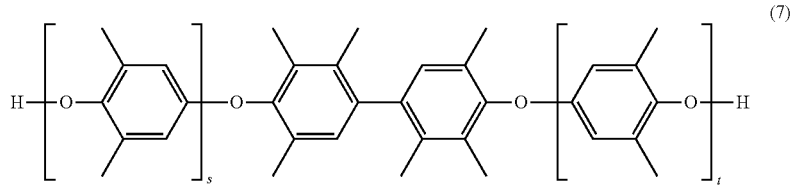
(7)

In the formulae (6) and (7), "s" and "t" are the same as "s" and "t" in the formula (4).

[Chemical Formula 10]

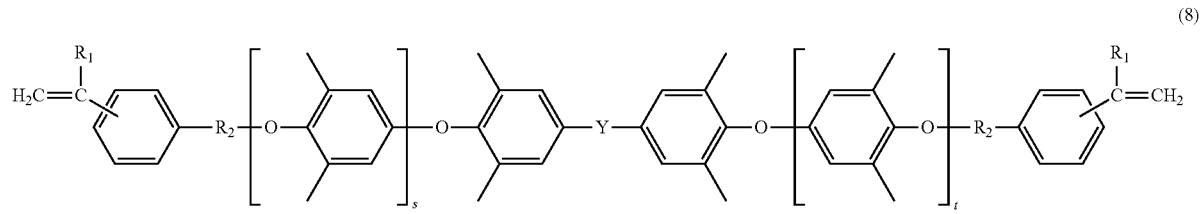
(8)

In the formula (8), "s" and "t" are the same as "s" and "t" in the formula (4), and "Y" is the same as "Y" in the formula (4). In the formula (8), $R^1$ and $R^2$ are the same as $R^1$ and $R^2$ in the formula (1).

[Chemical Formula 11]

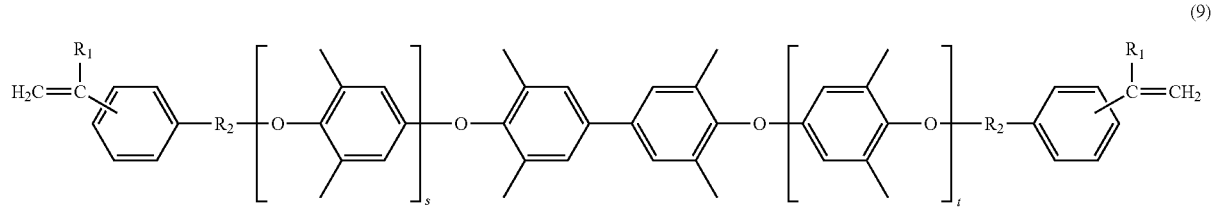
(9)

[Chemical Formula 12]

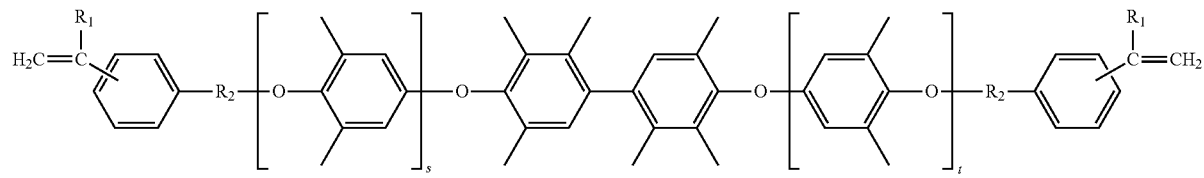

(10)

In the formulae (9) and (10), "s" and "t" are the same as "s" and "t" in the formula (4). In the formulae (9) and (10), $R^1$ and $R^2$ are the same as $R^1$ and $R^2$ in the formula (1).

[Chemical Formula 13]

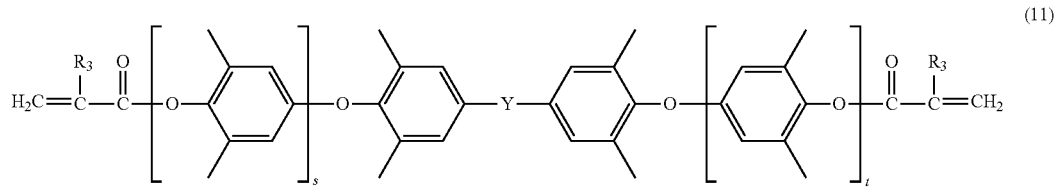

(11)

In the formula (11), "s" and "t" are the same as "s" and "t" in the formula (4), and "Y" is the same as "Y" in the formula (4). In the formula (11), $R^3$ is the same as $R^3$ in the formula (2).

[Chemical Formula 14]

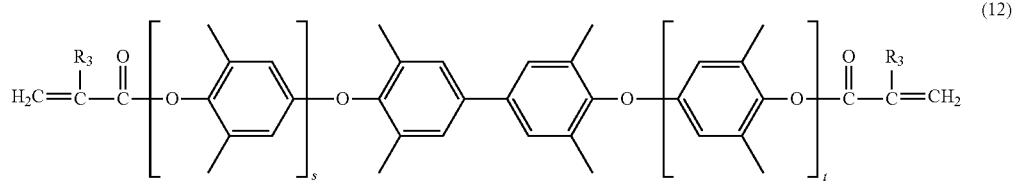

(12)

[Chemical Formula 15]

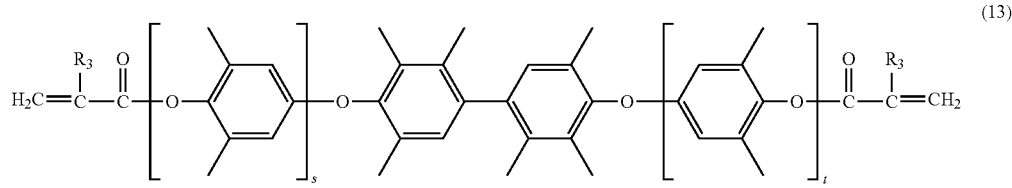

(13)

In the formulae (12) and (13), "s" and "t" are the same as "s" and "t" in the formula (4). In the formulae (12) and (13), $R^3$ is the same as $R^3$ in the formula (2).

The weight average molecular weight (Mw) of the polyphenylene ether copolymer used in the present embodiment is not particularly limited. Specifically, the weight average molecular weight (Mw) of the polyphenylene ether copolymer is preferably 500 to 5,000, more preferably 800 to 4,000, and still more preferably 1,000 to 3,000. Here, the weight average molecular weight may be any value as measured by a general molecular weight measuring method, and specific examples thereof include a value measured with use of gel permeation chromatography (GPC). When the polyphenylene ether copolymer has a repeating unit represented by the formula (3) in its molecule, "m" is preferably such a numerical value that provides the weight average molecular weight of the polyphenylene ether copolymer in such a range. Specifically, "m" is preferably 1 to 50.

When the weight average molecular weight of the polyphenylene ether copolymer is in such a range, the polyphenylene ether copolymer has excellent dielectric properties of the polyphenylene ether, and provides a cured product having not only more excellent heat resistance but also excellent moldability. This is considered to be due to following reasons. A normal polyphenylene ether having a weight average molecular weight in such a range has a relatively low molecular weight, so that the polyphenylene ether tends to provide a cured product having low heat resistance. In this respect, it is considered that the polyphenylene ether copolymer used in the present embodiment has the group represented by the formula (1) or (2) at its terminal, which provides a cured product having sufficiently high heat resistance. It is considered that, when the weight average molecular weight of the polyphenylene ether copolymer is in such a range, the polyphenylene ether copolymer has a relatively low molecular weight, and has also excellent moldability. Therefore, it is considered that such a polyphenylene ether copolymer provides a cured product having not only more excellent heat resistance but also excellent moldability.

A method for synthesizing a polyphenylene ether copolymer used in the present embodiment is not particularly limited as long as it can synthesize a polyphenylene ether copolymer having a group represented by the formula (1) or (2) at its terminal.

The thermosetting curing agent used in the present embodiment is not particularly limited as long as it is a thermosetting curing agent having two or more carbon-carbon unsaturated double bonds at its molecular terminal. Examples of the carbon-carbon unsaturated double bond include a double bond contained in an allyl group, a vinyl group, an acrylate group, a methacrylate group, and a maleimide group. The thermosetting curing agent is not particularly limited as long as the carbon-carbon unsaturated double bond can react with the polyphenylene ether copolymer to form a crosslink and thus cure the resin composition. The resin composition according to the present embodiment may contain a curing agent other than the thermosetting curing agent as long as it contains the thermosetting curing agent.

Specific examples of the thermosetting curing agent include a polyfunctional allyl compound having two or more allyl groups only at its molecular terminal such as triallyl isocyanurate (TALC), a polyfunctional methacrylate compound having two or more methacrylic groups at its molecular terminal such as trimethylolpropane trimethacrylate (TMPT), a polyfunctional acrylate compound having two or more acrylic groups at its molecular terminal, a vinylbenzyl compound such as divinylbenzene (DVB) having a vinylbenzyl group in its molecule, and a polyfunctional maleimide compound having two or more maleimide groups at its molecular terminal. The thermosetting curing agents exemplified above may be used alone or in combination of two or more.

The thermosetting curing agent preferably has a weight average molecular weight of 100 to 5,000, more preferably 100 to 4,000, and still more preferably 100 to 3,000. If the weight average molecular weight of the thermosetting curing agent is too low, the thermosetting curing agent may easily volatilize from a blended component system of the resin composition. If the weight average molecular weight of the thermosetting curing agent is too high, the viscosity of a varnish of the resin composition and melt viscosity during heat molding may become excessively high. Therefore, if the weight average molecular weight of the thermosetting curing agent is in such a range, the curable composition that provides a cured product having more excellent heat resistance is obtained. This is considered to be because a crosslink can suitably be formed due to the reaction of the thermosetting curing agent with the polyphenylene ether copolymer. Here, the weight average molecular weight may be any value as measured by a general molecular weight measuring method, and specific examples thereof include a value measured with use of gel permeation chromatography (GPC).

In the thermosetting curing agent, the average number of the carbon-carbon unsaturated double bonds (the number of terminal functional groups) per molecule of the thermosetting curing agent is, as described above, 2 or more, preferably 2 to 20, and more preferably 2 to 18. If the number of such terminal functional groups is too small, cured products having sufficient heat resistance tend to be less likely to be obtained. If the number of terminal functional groups is too large, the reactivity becomes excessively high, which may cause problems such as deterioration in the storability of the resin composition or deterioration in the flow properties of the resin composition, for example.

The number of terminal functional groups here is known from a standard value of a product of the thermosetting curing agent to be used. Specific examples of the number of terminal functional groups here include a numerical value representing the average number of the carbon-carbon unsaturated double bonds per molecule of all the thermosetting curing agents present in a mole of thermosetting curing agent.

The thermoplastic elastomer used in the present embodiment is not particularly limited, and a styrene-based thermoplastic elastomer is preferable. The styrene-based thermoplastic elastomer is preferably a styrene-based thermoplastic elastomer in which the content of a repeating unit having a carbon-carbon unsaturated double bond other than an aromatic ring is less than 10 mol % of that of all repeating units. That is, the styrene-based thermoplastic elastomer is preferably a styrene-based thermoplastic elastomer in which the number of moles of carbon-carbon unsaturated double bonds excluding an aromatic ring contained in a mole of the styrene-based thermoplastic elastomer is less than 10 mol %. The abundance mole ratio (total abundance ratio) of the carbon-carbon unsaturated double bond can be calculated by, for example, a method for determining the ratio of a repeating unit having a carbon-carbon unsaturated double bond other than an aromatic ring to all repeating units. In the styrene-based thermoplastic elastomer, the number of a repeating unit having a carbon-carbon unsaturated double bond other than an aromatic ring is preferably less than 10 mol % of all repeating units, more preferably 0 to 5 mol %, and still more preferably 0 to 2 mol %. The number of the carbon-carbon unsaturated double bonds other than an aromatic ring contained in the styrene-based thermoplastic elastomer is preferably smaller, and the ratio is particularly preferably 0 mol %. The resin composition contains the thermoplastic elastomer, which provides a layer that has a high adhesive force between the metal foil and the insulating layer and suppresses a decrease in the adhesive force between the metal foil and the insulating layer due to heating and moisture absorption as the insulating layer 12. Furthermore, the styrene-based thermoplastic elastomer in which the content of a repeating unit having a carbon-carbon unsaturated double bond other than an aromatic ring is less than 10 mol % of that of all repeating units is used as the thermoplastic elastomer, which makes it possible to suppress the occurrence of thermal deterioration of dielectric properties.

The carbon-carbon unsaturated double bond contained in the styrene-based thermoplastic elastomer includes not only a carbon-carbon unsaturated double bond present at its molecular terminal but also a carbon-carbon unsaturated double bond contained in its molecular chain. That is, the repeating unit having a carbon-carbon unsaturated double bond other than an aromatic ring includes a carbon-carbon unsaturated double bond present at its molecular terminal and a carbon-carbon unsaturated double bond contained in its molecular chain. In the styrene-based thermoplastic elastomer, the carbon-carbon unsaturated double bond contained in its molecular chain is preferably smaller even in the carbon-carbon unsaturated double bond other than an aromatic ring from the viewpoint of suppressing the occurrence of thermal deterioration of dielectric properties. Specifically, in the styrene-based thermoplastic elastomer, the content of the repeating unit having a carbon-carbon double bond contained in its molecular chain among the repeating units having a carbon-carbon unsaturated double bond other than an aromatic ring is preferably less than 3 mol % of all the repeating units, preferably 0 to 2 mol %, and more preferably 0 to 1 mol %. The styrene-based thermoplastic elastomer in which the abundance ratio (the abundance ratio in the molecular chain) of the carbon-carbon unsaturated double bonds in its molecular chain falls within the above range is used, which makes it possible to suppress the occurrence of thermal deterioration of dielectric properties. Examples of the carbon-carbon unsaturated double bond contained in its molecular chain other than an aromatic ring include a vinylene group.

Examples of the thermoplastic elastomer include a hydrogenated styrene-based thermoplastic elastomer. More specific examples include a styrene-based thermoplastic elastomer hydrogenated so that the content ratio of repeating units having a carbon-carbon unsaturated double bond is less than 10 mol % of all repeating units. Specific examples of the thermoplastic elastomer include at least one obtained by hydrogenating all or a part of double bonds selected from the group consisting of a methylstyrene (ethylene/butylene) methylstyrene copolymer, a styrene (ethylene/propylene) styrene copolymer, a styrene (ethylene/butylene) styrene copolymer, a styrene (butadiene/isoprene) styrene copolymer, and a styrene isoprene styrene copolymer. More specific examples of the thermoplastic elastomer include a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, a hydrogenated styrene (ethylene/propylene) styrene copolymer, and a hydrogenated styrene (ethylene-ethylene/propylene) styrene copolymer. As the thermoplastic elastomer, the above exemplified compounds may be used alone or in combination of two or more.

The thermoplastic elastomer preferably has a weight average molecular weight of 10,000 to 300,000, more preferably 50,000 to 250,000, and still more preferably 60,000 to 200,000. If the molecular weight of the thermoplastic elastomer is too small, the glass transition temperature of the cured product tends to be decreased, or the heat resistance of the cured product tends to be deteriorated. If the molecular weight of the thermoplastic elastomer is too large, the viscosity of the varnish of the resin composition and melt viscosity during heat molding may become excessively high. Therefore, when the weight average molecular weight of the thermoplastic elastomer falls within the above range, the glass transition temperature and the heat resistance are more excellent, and the decrease in the adhesive force between the metal foil and the insulating layer due to heating and moisture absorption can be further suppressed.

The content of the polyphenylene ether copolymer is preferably 20 to 80 parts by mass, and more preferably 30 to 70 parts by mass with respect to a total of 100 parts by mass of the polyphenylene ether copolymer, the thermosetting curing agent, and the thermoplastic elastomer.

The content of the thermosetting cured product is preferably 10 to 50 parts by mass, and more preferably 20 to 40 parts by mass with respect to a total of 100 parts by mass of the polyphenylene ether copolymer, the thermosetting curing agent, and the thermoplastic elastomer.

If any one of the content of the polyphenylene ether copolymer and the content of the thermosetting curing agent is too little or too much, a suitable cured product tends to be less likely to be obtained. Specifically, the ratio of the content of the polyphenylene ether copolymer to the content of the thermosetting curing agent is preferably 50:50 to 90:10 at a ratio by mass. If the content of the polyphenylene ether copolymer is too small, there is a tendency that excellent dielectric properties of the polyphenylene ether cannot be sufficiently exhibited. If the content of the polyphenylene ether copolymer is too much, the glass transition temperature of the cured product tends to be decreased. Therefore, when the content of the polyphenylene ether copolymer and the content of the thermosetting curing agent fall within the above ranges, a curing reaction between the polyphenylene ether copolymer and the thermosetting curing agent suitably proceeds, which provides a cured product having excellent dielectric properties and a high glass transition temperature.

The ratio of the total of the content of the polyphenylene ether copolymer and the content of the thermosetting curing agent to the content of the thermoplastic elastomer is preferably 50:50 to 90:10 at a ratio by mass, and more preferably 75:25 to 90:10. That is, the content of the thermoplastic elastomer is preferably 10 to 50 parts by mass, and more preferably 10 to 25 parts by mass with respect to a total of 100 parts by mass of the polyphenylene ether copolymer, the thermosetting curing agent, and the thermoplastic elastomer. If the content of the thermoplastic elastomer is too small, there is a tendency that the adhesive force between the metal foil and the insulating layer is increased, and the effect of suppressing the decrease in the adhesive force between the metal foil and the insulating layer due to heating and moisture absorption cannot be sufficiently exhibited. If the content of the thermoplastic elastomer is too much, the viscosity of the resin composition is increased, which tends to cause deterioration in impregnation property of the resin composition to the fibrous substrate and the like.

The resin composition according to the present embodiment may contain an organic peroxide. The organic peroxide is not particularly limited. The organic peroxide can promote a curing reaction between the polyphenylene ether copolymer and the thermosetting curing agent. Examples of the organic peroxide include ad-bis(t-butylperoxy-m-isopropyl)benzene, dicumyl peroxide, 2,5-dimethyl-2,5-di(t-butylperoxy)hexane, di-t-butylperoxide, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. From the viewpoint of a reaction start temperature, the organic peroxide is preferably a dialkyl organic peroxide. Among the organic peroxides exemplified, α,α'-bis(t-butylperoxy-m-isopropyl)benzene is preferably used. α,α'-bis(t-butylperoxy-m-isopropyl)benzene has a relatively high reaction start temperature, whereby the promotion of the curing reaction when curing is not required such as during prepreg drying can be suppressed. By suppressing the curing reaction, deterioration in the storability of the resin composition can be suppressed. Furthermore, α,α'-bis(t-butylperoxy-m-isopropyl)benzene has low volatility, whereby it has excellent stability without volatilizing during prepreg drying and preservation. The organic peroxides may be used alone or in combination of two or more.

The content of the organic peroxide is preferably 0.1 to 10 parts by mass, and more preferably 0.5 to 2 parts by mass with respect to a total of 100 parts by mass of the polyphenylene ether copolymer, the thermosetting curing agent, and the thermoplastic elastomer. When the content of the organic peroxide is too low, there is a tendency that the effect provided by the contained organic peroxide cannot be sufficiently exhibited. When the content of the organic peroxide is too high, the dielectric properties and heat resistance of the obtained cured product tend to be adversely affected.

The resin composition according to the present embodiment may contain a flame retardant. The resin composition contains the flame retardant, whereby the flame retardancy of the cured product of the resin composition can be improved. The flame retardant is not particularly limited. Specifically, in the field where a halogen-based flame retardant such as a bromine-based flame retardant is used, ethylene dipentabromobenzene, ethylene bistetrabromoimide, decabromodiphenyloxyde, and tetradecabromodiphenoxybenzene that have a melting point of 300° C. or higher are preferable. It is considered that the use of the halogen-based flame retardant can suppress halogen elimination at high temperatures, and can suppress a decrease in heat resistance. In the field where a halogen-free flame retardant is required, examples thereof include a phosphoric-acid-ester-based flame retardant, a phosphazene-based flame retardant, a bisdiphenylphosphine oxide-based flame retardant, and a phosphinate-based flame retardant. Specific examples of the phosphoric-acid-ester-based flame retardant include a condensed phosphoric acid ester such as dixylenyl phosphate. Specific examples of the phosphazene-based flame retardant include phenoxyphosphazene. Specific examples of the bisdiphenylphosphine oxide-based flame retardant include xylylene bisdiphenylphosphine oxide. Specific examples of the phosphinate-based flame retardant include metal phosphinates such as aluminum dialkylphosphinate. As the flame retardant, the flame retardants exemplified above may be used alone or in combination of two or more.

The resin composition according to the present embodiment may further contain additives such as a silane coupling agent, a defoaming agent, an antioxidant, a heat stabilizer, an antistatic agent, an ultraviolet absorber, a dye, a pigment, a lubricant, and an inorganic filler as needed, as long as the effects of the present invention are not impaired. In particular, the silane coupling agent is suitably used for improving the adhesion with the metal foil and the adhesion between resins, and preferably has a carbon-carbon unsaturated double bond. Examples of the silane coupling agent include a silane coupling agent having a methacrylic group in its molecule, and a silane coupling agent having a vinyl group in its molecule.

The resin composition used in the present embodiment may be used after prepared into varnish. For example, when a prepreg is produced, the resin composition may be used after prepared into varnish, for purpose of impregnating a substrate (fibrous substrate) for forming the prepreg with the resin composition. That is, the resin composition may be used after prepared into varnish (resin varnish). In the resin composition used in the present embodiment, the polyphenylene ether copolymer, the thermosetting curing agent, and the thermoplastic elastomer are dissolved in the resin varnish. Such a varnish-like composition (resin varnish) is prepared as follows, for example.

First, components that can be dissolved in an organic solvent are added to and dissolved in the organic solvent. In this case, heating may be conducted as needed. Thereafter, a component that is used as needed and is not dissolved in the organic solvent is added to and dispersed in the mixed solution with use of a ball mill, a bead mill, a planetary mixer, or a roller mill or the like, until the solution becomes a predetermined dispersed state. Thus, a varnish-like composition is prepared. The organic solvent used here is not particularly limited as long as the organic solvent dissolves the polyphenylene ether copolymer, the thermosetting curing agent, and the thermoplastic elastomer and does not inhibit the curing reaction. Specific examples thereof include toluene and methyl ethyl ketone (MEK).

As described above, the insulating layer may contain not only the cured product of the resin composition but also a fibrous substrate. As the fibrous substrate, the same fibrous substrate contained in a prepreg described later can be used.

With use of the resin composition, not only the metal-clad laminate but also a prepreg, a metal foil with resin, and a wiring board can be obtained as follows. In this case, the varnish-like composition as described above may be used as the resin composition.

The prepreg includes the resin composition or a semi-cured product of the resin composition and a fibrous substrate. Examples of the prepreg include a prepreg in which the fibrous substrate is present in the semi-cured product. That is, the prepreg includes the resin composition or the semi-cured product of the resin composition, and the fibrous substrate present in the resin composition or the semi-cured product of the resin composition.

In the present embodiment, the semi-cured product is a product obtained by partway curing the resin composition to such an extent that the product can be further cured. That is, the semi-cured product is in a semi-cured state of the resin composition (in a stage B). For example, when the resin composition is heated, the resin composition gradually decreases the viscosity at first, and thereafter starts to be cured with a gradual increase of viscosity. In such a case, examples of semi-curing include a state from the viscosity starting to increase to before the resin composition being completely cured.

The prepreg may include the semi-cured product of the resin composition as described above, or may include the resin composition that is not yet cured. That is, the prepreg may include the semi-cured product of the resin composition (the resin composition in the stage B) and the fibrous substrate, or may include the resin composition that is uncured (the resin composition in a stage A) and the fibrous substrate.

A method for producing the prepreg is not particularly limited as long as it can produce the prepreg. Examples thereof include a method for impregnating the fibrous substrate with the resin composition, for example, the resin composition that has been prepared into varnish. That is, examples of the prepreg include a prepreg obtained by impregnating the fibrous substrate with the resin composition. An impregnation method is not particularly limited as long as it enables impregnation of the fibrous substrate with the resin composition. For example, the impregnation method is not limited to dipping, and examples thereof include methods using rolling, die coating, and bar coating, and spraying. As the method for producing the prepreg, the fibrous substrate that has been impregnated with the resin composition may be dried or heated after the impregnation. That is, examples of the method for producing the prepreg include a method for impregnating the fibrous substrate with the resin composition that has been prepared into varnish and then drying the fibrous substrate, a method for impregnating the fibrous substrate with the resin composition that has been prepared into varnish and then heating the fibrous substrate, and a method for impregnating the fibrous substrate with the resin composition that has been prepared into varnish, and drying and then heating the fibrous substrate.

Specific examples of the fibrous substrate used in the production of the prepreg include glass cloth, aramid cloth, polyester cloth, nonwoven glass fabric, nonwoven aramid fabric, nonwoven polyester fabric, pulp paper, and linter paper. The use of the glass cloth provides a laminate having excellent mechanical strength. In particular, glass cloth subjected to a flattening treatment is preferable. Specifically, the flattening treatment can be performed, for example, by continuously applying an appropriate level of pressure to glass cloth with a press roll to compress yarns of the glass cloth flat. The thickness of the fibrous substrate that can generally be used is 0.04 to 0.3 mm, for example.

The fibrous substrate is impregnated with the resin composition by immersion and application and the like. This impregnation can also be repeated a plurality of times, as needed. In this case, it is also possible to adjust the composition and an amount to be impregnated of the resin composition to finally intended ones by repeating the impregnation with use of a plurality of resin compositions having different compositions and concentrations.

The fibrous substrate that has been impregnated with the resin composition is heated under desired heating conditions, for example, a temperature of 80° C. to 180° C. for a period of 1 minute to 10 minutes, to provide the prepreg that is not yet cured (stage A) or in the semi-cured state (stage B).

Such a prepreg can provide the metal-clad laminate and the wiring board and the like that have a reduced loss during signal transmission, have a high adhesive force between the metal foil and the insulating layer, and sufficiently suppress a decrease in the adhesive force between the metal foil and the insulating layer due to heating and moisture absorption.

A method for producing the metal-clad laminate according to the present embodiment is not particularly limited as long as it can produce the metal-clad laminate. As the method for producing a metal-clad laminate, for example, the metal-clad laminate can be obtained in the same manner as in a general method for producing a metal-clad laminate except for using the resin composition. Examples thereof include a method for using the prepreg containing the resin composition. Examples of the method for preparing the metal-clad laminate with use of the prepreg include a method for stacking a prepreg or a plurality of prepregs with a metal foil such as a copper foil stacked on both or one surface of the stacked body and integrally laminating the stacked body by hot-press molding. That is, the method for producing the metal-clad laminate includes the steps of: obtaining the resin composition; impregnating the fibrous substrate with the resin composition to obtain the prepreg; and laminating the metal foil on the prepreg by hot-press molding to obtain the metal-clad laminate including the insulating layer containing the cured product of the resin composition and the metal foil being in contact with at least one surface of the insulating layer. By the method, a double-sided metal-clad laminate or a single-sided metal-clad laminate can be prepared. That is, examples of the metal-clad laminate according to the present embodiment include a metal-clad laminate obtained by stacking the metal foil on the prepreg and subjecting the stacked body to hot-press molding. A hot press condition can be appropriately set according to the thickness of the laminate to be produced and the type of the resin composition contained in the prepreg, and the like. For example, the temperature can be set to 170° C. to 210° C.; the pressure can be set to 2.5 MPa to 4 MPa; and the period can be set to 60 minutes to 150 minutes. The metal-clad laminate may be produced without using the prepreg. Examples of the method for producing the metal-clad laminate without using the prepreg include a method for applying the resin composition such as a varnish-like resin composition onto the metal foil to form a layer containing the curable composition on the metal foil, and then hot-pressing the metal foil on which the layer has been formed.

Figure 2:
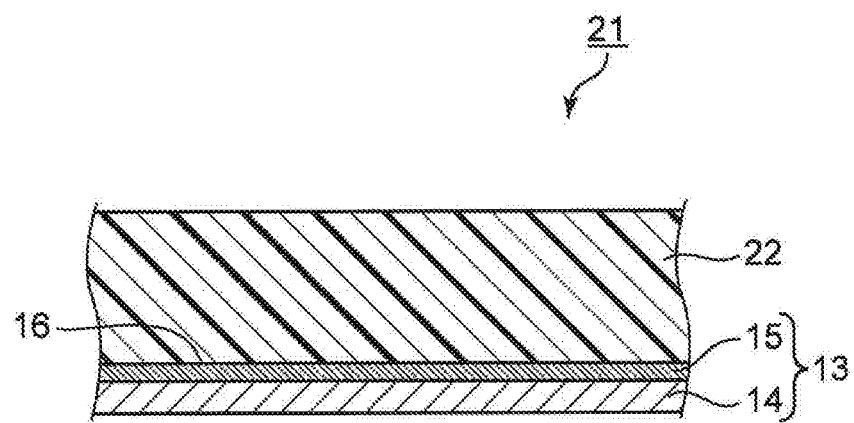
FIG. 2 is a cross-sectional view showing a configuration of a metal foil with resin according to another embodiment of the present invention.

A metal foil with resin according to another embodiment of the present invention includes an insulating adhesive layer and a metal foil being in contact with one surface of the insulating adhesive layer. As shown in FIG. 2, a metal foil with resin 21 includes an insulating adhesive layer 22 and a metal foil 13 disposed so as to be in contact with one surface of the insulating adhesive layer 22. FIG. 2 is a cross-sectional view showing the configuration of the metal foil with resin 21 according to the present embodiment.

The insulating adhesive layer 22 contains the resin composition (the resin composition in the stage A), or the semi-cured product of the resin composition (the resin composition in the stage B) as described above. The insulating adhesive layer necessarily contain the resin composition or the semi-cured product of the resin composition, and may or may not include a fibrous substrate. As the fibrous substrate, the same fibrous substrate as that in the prepreg can be used. The curing causes the insulating adhesive layer to serve as an insulating layer, for example, an insulating layer of a wiring board.

The metal foil 13 is the same as the metal foil provided in the metal-clad laminate. Specifically, the metal foil 13 includes a metal substrate 14 and a barrier layer 15 provided on at least a contact surface 16 of the metal substrate 14, the contact surface 16 being in contact with an insulating adhesive layer 22. As shown in FIG. 2, examples of the metal foil 13 include a metal foil including a metal substrate 14 and a barrier layer 15 provided on at least a contact surface 16 of the metal substrate 14, the contact surface 16 being in contact with an insulating adhesive layer 22. The metal foil may include the barrier layer provided on each of both the surfaces of the metal substrate. The contact surface 16 has a ten-point average roughness Rz of 2 μm or less as a surface roughness.

A method for producing the metal foil with resin according to the present embodiment is not particularly limited as long as it can produce the metal foil with resin. In the method for producing the metal foil with resin, a metal foil with resin can be obtained in the same manner as a general method for producing a metal foil with resin except for using that the resin composition. Examples thereof include a method for applying the resin composition, for example, the resin composition that has been prepared into varnish onto the metal foil. That is, examples of the metal foil with resin according to the present embodiment include a metal foil obtained by applying the resin composition to the metal foil. An application method is not particularly limited as long as it enables application of the resin composition to the metal foil. Examples of the application method include methods using rolling, die coating, and bar coating, and spraying. In the method for producing the metal foil with resin, the metal foil to which the resin composition has been applied may be dried or heated after the application. That is, examples of the method for producing the metal foil with resin include a method for applying the resin composition that has been prepared into varnish, onto the metal foil and then drying the metal foil, a method for applying the resin composition that has been prepared into varnish, onto the metal foil and then heating the metal foil, and a method for applying the resin composition that has been prepared into varnish, onto the metal foil, and drying and then heating the metal foil. The metal foil to which the resin composition has been applied is heated under desired heating conditions, for example, at a temperature of 80° C. to 180° C. for a period of 1 minute to 10 minutes, to provide the metal foil with resin that is not yet cured (stage A) or in the semi-cured state (stage B).

Such a metal foil with resin has a reduced loss during signal transmission, has a high adhesive force between the metal foil and the insulating layer obtained by curing the insulating adhesive layer, and sufficiently suppresses a decrease in the adhesive force between the metal foil and the insulating layer due to heating and moisture absorption as with the metal-clad laminate.

A wiring board according to still another embodiment of the present invention includes an insulating layer and wiring being in contact with at least one surface of the insulating layer. That is, the wiring board includes wiring on the surface of the insulating layer. The wiring board 31 includes, as illustrated in FIG. 3, an insulating layer 12 and wiring 17 disposed in contact with each of both the surfaces of the insulating layer. The wiring board may include wiring only on and in contact with one surface of the insulating layer. FIG. 3 is a cross-sectional view showing the configuration of the wiring board 31 according to the present embodiment.

Examples of the insulating layer 12 include the same layer as the insulating layer of the metal-clad laminate.

As shown in FIG. 3, the wiring 17 includes a metal substrate 18 and a barrier layer 19 provided on at least a contact surface 20 of the metal substrate 18, the contact surface 20 being in contact with the insulating layer 12. Examples of the wiring 17 include wiring formed by partially removing the metal foil of the metal-clad laminate. Examples of such wiring include wiring formed by a method such as a subtractive method, an additive method, a semi-additive method, chemical mechanical polishing (CMP), trenching, ink-jet printing, squeegee, or transferring. That is, examples of the wiring 17 include wiring attributable to the metal foil provided in the metal-clad laminate. Specifically, the wiring 17 includes the metal substrate 18 and the barrier layer 19 provided on at least the contact surface 20 of the metal substrate 18, the contact surface 20 being in contact with the insulating layer 12. The wiring 17 includes, as shown in FIG. 3, the metal substrate 18 and the barrier layer 19 provided on at least the contact surface 20 of the metal substrate 18, the contact surface 20 being in contact with the insulating layer 12. The wiring may include the barrier layer on each of both the surfaces of the metal substrate. The contact surface 20 has, as surface roughness, a ten-point average roughness Rz of 2 μm or less.

A method for producing the wiring board according to the present embodiment is not particularly limited as long as it can produce the wiring board using the metal-clad laminate or the metal foil with resin. Examples of the method for producing the wiring board include a general method for producing a wiring board with use of a metal-clad laminate. Examples of the method for producing the wiring board with use of the metal-clad laminate include a method for subjecting the metal foil on the surface of the metal-clad laminate to etching to form a circuit. The method can provide the wiring board including a conductor pattern as the circuit on the surface of the metal-clad laminate. That is, the wiring board according to the present embodiment is obtained by partially removing the metal foil on the surface of the metal-clad laminate to form the circuit. The method for producing the wiring board includes the steps of: obtaining the resin composition; impregnating a fibrous substrate with the resin composition to obtain a prepreg; laminating a metal foil on the prepreg by hot-press molding to obtain a metal-clad laminate including an insulating layer including a cured product of the resin composition and a metal foil being in contact with at least one surface of the insulating layer; and forming wiring being in contact with at least one surface of the insulating layer by partially removing the metal foil of the metal-clad laminate.

Such a wiring board has a reduced loss during signal transmission, has a high adhesive force between the wiring and the insulating layer, and sufficiently suppresses a decrease in the adhesive force between the wiring and the insulating layer due to heating and moisture absorption.

As described above, the present specification discloses techniques of various aspects, among which main techniques are summarized below.

One aspect of the present invention is a metal-clad laminate comprising: an insulating layer; and a metal foil being in contact with at least one surface of the insulating layer, wherein: the insulating layer contains a cured product of a resin composition containing a polyphenylene ether copolymer having an intrinsic viscosity of 0.03 to 0.12 dl/g measured in methylene chloride at 25° C. and having an average of 1.5 to 3 groups represented by the following formula (1) or (2) per molecule at its molecular terminal, a thermosetting curing agent having two or more carbon-carbon unsaturated double bonds at its molecular terminal, and a thermoplastic elastomer; the metal foil includes a metal substrate, and a cobalt-containing barrier layer provided on at least a contact surface of the metal substrate, the contact surface being in contact with the insulating layer; and the contact surface has a ten-point average roughness Rz of 2 μm or less as a surface roughness.

[Chemical Formula 16]

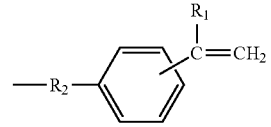

(1)

In the formula (1), $R_1$ represents a hydrogen atom or an alkyl group having 1 to 10 carbon atoms, and $R_2$ represents an alkylene group having 1 to 10 carbon atoms.

[Chemical Formula 17]

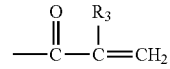

(2)

In the formula (2), $R_3$ represents a hydrogen atom or an alkyl group having 1 to 10 carbon atoms.

Such a configuration can provide the metal-clad laminate that has a reduced loss during signal transmission, has a high adhesive force between the metal foil and the insulating layer, and sufficiently suppresses a decrease in the adhesive force between the metal foil and the insulating layer due to heating and moisture absorption.

In the metal-clad laminate, the thermoplastic elastomer is preferably a styrene-based thermoplastic elastomer.

Such a configuration can provide the metal-clad laminate that has a reduced loss during signal transmission, has a high adhesive force between the metal foil and the insulating layer, and further suppresses a decrease in the adhesive force between the metal foil and the insulating layer due to heating and moisture absorption.

In the metal-clad laminate, the styrene-based thermoplastic elastomer is preferably at least one obtained by hydrogenating all or a part of double bonds selected from the group consisting of a methyl styrene (ethylene/butylene) methyl styrene copolymer, a styrene (ethylene/propylene) styrene copolymer, a styrene (ethylene/butylene) styrene copolymer, a styrene (butadiene/isoprene) styrene copolymer, and a styrene isoprene styrene copolymer.

Such a configuration can provide the metal-clad laminate that has a reduced loss during signal transmission, has a high adhesive force between the metal foil and the insulating layer, and further suppresses a decrease in the adhesive force between the metal foil and the insulating layer due to heating and moisture absorption.

In the metal-clad laminate, the styrene-based thermoplastic elastomer is preferably at least one selected from the group consisting of a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, a hydrogenated styrene (ethylene/propylene) styrene copolymer, and a hydrogenated styrene (ethylene-ethylene/propylene) styrene copolymer.

Such a configuration can provide the metal-clad laminate that has a reduced loss during signal transmission, has a high adhesive force between the metal foil and the insulating layer, and further suppresses a decrease in the adhesive force between the metal foil and the insulating layer due to heating and moisture absorption.

In the metal-clad laminate, a ratio of a total of a content of the polyphenylene ether copolymer and a content of the thermosetting curing agent to a content of the thermoplastic elastomer is preferably 50:50 to 90:10 at a ratio by mass.

Such a configuration can provide the metal-clad laminate that has a reduced loss during signal transmission, has a high adhesive force between the metal foil and the insulating layer, and further suppresses a decrease in the adhesive force between the metal foil and the insulating layer due to heating and moisture absorption.

In the metal-clad laminate, it is preferable that the resin composition further contains a silane coupling agent, and the silane coupling agent has at least one selected from the group consisting of a vinyl group, a styryl group, a methacrylic group, and an acrylic group in its molecule.

Such a configuration can provide the metal-clad laminate that has a reduced loss during signal transmission, has a high adhesive force between the metal foil and the insulating layer, and sufficiently suppresses a decrease in the adhesive force between the metal foil and the insulating layer due to heating and moisture absorption.

Another aspect of the present invention is a metal foil with resin comprising: an insulating adhesive layer; and a metal foil being in contact with at least one surface of the insulating adhesive layer, wherein: the insulating adhesive layer contains a resin composition or a semi-cured product of the resin composition, the resin composition containing a polyphenylene ether copolymer having an intrinsic viscosity of 0.03 to 0.12 dl/g measured in methylene chloride at 25° C. and having an average of 1.5 to 3 groups represented by the above formula (1) or (2) per molecule at its molecular terminal, a thermosetting curing agent having two or more carbon-carbon unsaturated double bonds at its molecular terminal, and a thermoplastic elastomer; the metal foil includes a metal substrate, and a cobalt-containing barrier layer provided on at least a contact surface of the metal substrate, the contact surface being in contact with the insulating adhesive layer; and the contact surface has a ten-point average roughness Rz of 2 µm or less as a surface roughness.

Such a configuration can provide the metal foil with resin that has a reduced loss during signal transmission, has a high adhesive force between the metal foil and the insulating layer obtained by curing the insulating adhesive layer, and sufficiently suppresses a decrease in the adhesive force between the metal foil and the insulating layer due to heating and moisture absorption.

Still another aspect of the present invention is a wiring board comprising: an insulating layer; and wiring being in contact with at least one surface of the insulating layer, wherein: the insulating layer contains a cured product of a resin composition containing a polyphenylene ether copolymer having an intrinsic viscosity of 0.03 to 0.12 dl/g measured in methylene chloride at 25° C. and having an average of 1.5 to 3 groups represented by the above formula (1) or (2) per molecule at its molecular terminal, a thermosetting curing agent having two or more carbon-carbon unsaturated double bonds at its molecular terminal, and a thermoplastic elastomer; the metal foil wiring includes a metal substrate, and a cobalt-containing barrier layer provided on at least a contact surface of the metal substrate, the contact surface being in contact with the insulating layer; and the contact surface has a ten-point average roughness Rz of 2 µm or less as a surface roughness.

Such a configuration can provide the wiring board that has a reduced loss during signal transmission, has a high adhesive force between the wiring and the insulating layer, and sufficiently suppresses a decrease in the adhesive force between the wiring and the insulating layer due to heating and moisture absorption.

The present invention can provide the metal-clad laminate, the metal foil with resin, and the wiring board that have a reduced loss during signal transmission, have a high adhesive force between the metal foil and the insulating layer, and sufficiently suppress a decrease in the adhesive force between the metal foil and the insulating layer due to heating and moisture absorption.

Hereinafter, the present invention will be more specifically described by way of Examples, but the scope of the present invention is not limited thereto.

EXAMPLES

Examples 1 and 3 to 20, and Comparative Examples 1 to 5

In the present Examples, components used when a resin composition is prepared will be described.

(Polyphenylene Ether Copolymer: Modified PPE)

Modified PPE1: a modified polyphenylene ether compound as a modified polyphenylene ether obtained by modifying a terminal hydroxy group of a polyphenylene ether with a methacrylic group (having a structure represented by the formula (11), wherein $R_3$ is a methyl group, and "Y" is a dimethylmethylene group (represented by the formula (5), wherein $R_9$ and $R_{10}$ are methyl groups), SA9000 manufactured by SABIC Innovative Plastics, intrinsic viscosity (IV) in methylene chloride at 25° C.: 0.085 dl/g, weight average molecular weight Mw: 1700, the number of terminal functional groups (in Tables 1 and 2, simply expressed as "the number of functional groups"): 1.8)

The intrinsic viscosity is obtained by measuring a 0.18 g/45 ml methylene chloride solution (liquid temperature:

25° C.) of the modified polyphenylene ether with a viscometer (AVS500 Visco System manufactured by SCHOTT Instruments GmbH).

Modified PPE2:
a modified polyphenylene ether obtained by reacting a polyphenylene ether with chloromethylstyrene.

Specifically, the modified PPE2 is a modified polyphenylene ether obtained through a reaction described below.

First, into a 1-L three-necked flask equipped with a temperature controller, a stirring device, a cooling unit, and a tap funnel, 200 g of a polyphenylene ether (SA90 manufactured by SABIC Innovative Plastics, 2 terminal hydroxy groups, weight average molecular weight Mw: 1700), 30 g of a mixture of p-chloromethylstyrene and m-chloromethylstyrene at a ratio by mass of 50:50 (chloromethylstyrene (CMS) manufactured by Tokyo Chemical Industry Co., Ltd.), 1.227 g of tetra-n-butylammonium bromide as a phase-transfer catalyst, and 400 g of toluene were charged, followed by stirring. The stirring was conducted until polyphenylene ether, chloromethylstyrene, and tetra-n-butylammonium bromide were dissolved in toluene. During the stirring, the mixture was gradually heated until a liquid temperature reached 75° C. in the end. To the solution, an aqueous sodium hydroxide solution (20 g of sodium hydroxide/20 g of water) as an alkali metal hydroxide was added dropwise over 20 minutes. Then, stirring was conducted at 75° C. for another 4 hours. Next, contents of the flask were neutralized with 10%-by-mass hydrochloric acid, followed by addition of a great amount of methanol. This generated a precipitate in the liquid of the flask. That is, a product contained in the reaction solution in the flask was reprecipitated. The precipitate was taken out by filtration, washed three times with a mixed liquid of methanol and water at a ratio by mass of 80:20, and then dried under reduced pressure at 80° C. for 3 hours.

The obtained solid was subjected to $^1$H-NMR (400 MHz, CDCl$_3$, TMS) analysis. As the result of NMR measurement, a peak attributable to a vinylbenzyl group (ethenylbenzyl group) was confirmed at 5 ppm to 7 ppm. Thus, the obtained solid could be confirmed to be a modified polyphenylene ether having the vinylbenzyl group as a substituent at its molecular terminal in a molecule. Specifically, the obtained solid could be confirmed to be an ethenylbenzylated polyphenylene ether. The obtained modified polyphenylene ether compound was a modified polyphenylene ether compound represented by the formula (8), wherein "Y" is was dimethylmethylene group (represented by the formula (5), wherein R$_9$ and R$_{10}$ were methyl groups); R$_1$ was a hydrogen atom; and R$_2$ was a methylene group.

The number of terminal functional groups in the modified polyphenylene ether was measured as follows.

First, the modified polyphenylene ether was accurately weighed. The weight is defined as X (mg). The modified polyphenylene ether thus weighed was dissolved in 25 mL of methylene chloride. To the solution was added 100 μL of an ethanol solution containing 10% by mass of tetraethylammonium hydroxide (TEAH) (TEAH:ethanol (volume ratio)=15:85). Then, the solution was measured for absorbance (Abs) at 318 nm with use of a UV spectrophotometer (UV-1600 manufactured by SHIMADZU CORPORATION). Based on the measurement result, the number of terminal hydroxy groups in the modified polyphenylene ether was calculated with use of the following formula.

Remaining OH amount (μmol/g)=[(25×Abs)/(ε× OPL×X)]×10$^6$

Here, ε represents an absorption coefficient, and is 4700 L/mol·cm. OPL is a cell optical path length and is 1 cm.

The remaining OH amount (the number of terminal hydroxy groups) in the modified polyphenylene ether thus calculated was near zero, which indicated that almost all the hydroxy groups in the unmodified polyphenylene ether are modified. This indicated that a decrease in the number of terminal hydroxy groups from the unmodified polyphenylene ether is the number of terminal hydroxy groups in the unmodified polyphenylene ether. That is, this indicated that the number of terminal hydroxy groups in the unmodified polyphenylene ether is the number of terminal functional groups in the modified polyphenylene ether. That is, the number of terminal functional groups was 2.

The modified polyphenylene ether was measured for an intrinsic viscosity (IV) in methylene chloride at 25° C. Specifically, the intrinsic viscosity (IV) of the modified polyphenylene ether was obtained by subjecting a solution containing the modified polyphenylene ether and methylene chloride at a concentration of 0.18 g/45 ml (liquid temperature: 25° C.) to measurement with a viscometer (AVS500 Visco System manufactured by SCHOTT Instruments GmbH). As the result, the intrinsic viscosity (IV) of the modified polyphenylene ether was 0.09 dl/g.

The modified polyphenylene ether was measured for a molecular weight distribution with use of GPC. A weight average molecular weight (Mw) was calculated from the obtained molecular weight distribution. As the result, the Mw was 1900.

Modified PPE3:
synthesized in the same method as in the synthesis of the modified PPE2 except for using a polyphenylene ether described below as the polyphenylene ether and conducting the synthesis under conditions described below.

The polyphenylene ether used was a polyphenylene ether (SA120 manufactured by SABIC Innovative Plastics, intrinsic viscosity (IV): 0.125 dl/g, 1 terminal hydroxy group, weight average molecular weight Mw: 2700).

Next, the reaction between the polyphenylene ether and the chloromethylstyrene was conducted with use of 200 g of the polyphenylene ether (SA120), 15 g of CMS, and 0.92 g of a phase-transfer catalyst (tetra-n-butylammonium bromide), and the modified PPE3 was synthesized in the same method as in the synthesis of the modified PPE2 except for using, in place of the aqueous sodium hydroxide solution (20 g of sodium hydroxide and 20 g of water), an aqueous sodium hydroxide solution (10 g of sodium hydroxide and 10 g of water).

The obtained solid was subjected to $^1$H-NMR (400 MHz, CDCl$_3$, TMS) analysis. As the result of NMR measurement, a peak attributable to an ethenylbenzyl group was confirmed at 5 ppm to 7 ppm. Thus, the obtained solid could be confirmed to be an ethenylbenzylated polyphenylene ether. The obtained modified polyphenylene ether compound was a modified polyphenylene ether compound represented by the following formula (14).

[Chemical Formula 18]

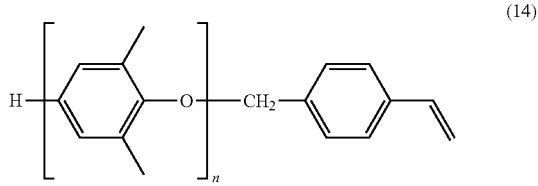

(14)

In the formula (14), "n" represents the number of repetitions satisfying the following Mw.

The number of terminal functional groups in the modified polyphenylene ether was measured in the same method as described above. As the result, the number of terminal functional groups was 1.

The modified polyphenylene ether was measured for the intrinsic viscosity (IV) in methylene chloride at 25° C. in the same method as the method described above. As the result, the intrinsic viscosity (IV) of the modified polyphenylene ether was 0.13 dl/g.

The Mw and high molecular weight component content of the modified polyphenylene ether were measured in the same method as the method described above. As the result, the Mw was 2800.

(Thermosetting Curing Agent: Thermosetting Curing Agent Having Two Or More Carbon-Carbon Unsaturated Double Bonds at Its Molecular Terminal)

TAIC: triallyl isocyanurate (a thermosetting curing agent having three carbon-carbon unsaturated double bonds at its molecular terminal, TAIC manufactured by Nippon Kasei Chemical Company Limited, weight average molecular weight Mw: 249)

DVB: divinylbenzene (a thermosetting curing agent having two carbon-carbon unsaturated double bonds at its molecular terminal, DVB-810 manufactured by NIPPON STEEL & SUMITOMO METAL CORPORATION, molecular weight: 130)

TMPT: trimethylolpropane trimethacrylate (a thermosetting curing agent having three carbon-carbon unsaturated double bonds at its molecular terminal, TMPT manufactured by Shin-Nakamura Chemical Co., Ltd., molecular weight: 338) (Thermoplastic Elastomer)

SEPTON V9827: a hydrogenated methylstyrene (ethylene/butylene) methylstyrene copolymer (SEPTON V9827 manufactured by Kuraray Co., Ltd.)

SEPTON 2002: a hydrogenated styrene (ethylene/propylene) styrene copolymer (SEPTON 2002 manufactured by Kuraray Co., Ltd.)

SEPTON 4033: a hydrogenated methylstyrene (ethylene-ethylene/propylene) methylstyrene copolymer (SEPTON 4033 manufactured by Kuraray Co., Ltd.)

SEPTON 8076: a hydrogenated methylstyrene (ethylene/butylene) methylstyrene copolymer (SEPTON 8076 manufactured by Kuraray Co., Ltd.)

Tuftec H1041: a hydrogenated styrene (ethylene/butylene) styrene copolymer (Tuftec H1041 manufactured by Asahi Kasei Corporation)

Tuftec P1500: a hydrogenated styrene (ethylene/butylene) styrene copolymer (Tuftec P1500 manufactured by Asahi Kasei Corporation)

Hybrar 7125: a hydrogenated styrene isoprene styrene copolymer (Hybrar 7125 manufactured by Kuraray Co., Ltd.)

Hybrar 5127: a styrene isoprene styrene copolymer (Hybrar 5127 manufactured by Kuraray Co., Ltd.)
(Reaction Initiator)

Perbutyl P: 1,3-bis(butylperoxyisopropyl)benzene (PERBUTYL P manufactured by NOF Corporation)
(Silane Coupling Agent)

Methacrylic group: a silane coupling agent having a methacrylic group (methacrylic silane group) in its molecule (3-methacryloxypropyltrimethoxysilane, KBM-503 manufactured by Shin-Etsu Chemical Co., Ltd.)

Vinyl group: a silane coupling agent having a vinyl group (vinylsilane group) in its molecule (vinyltriethoxysilane, KBM-1003 manufactured by Shin-Etsu Chemical Co., Ltd.)

(Inorganic Filler)

Silica particles: spherical silica treated with vinylsilane (SC2300-SVJ manufactured by Admatechs Co., Ltd.)
(Metal Foil)

Metal foil 1: a copper foil plated with cobalt (T9FZ-SV manufactured by Fukuda Metal Foil & Powder Co., Ltd., a copper foil including a cobalt barrier layer, Rz: 1.5 μm, thickness: 18 μm)

Metal foil 2: a copper foil plated with cobalt (T9DA-SV manufactured by Fukuda Metal Foil & Powder Co., Ltd., a copper foil including a cobalt barrier layer, Rz: 1.0 μm, thickness: 18 μm)

Metal foil 3: a copper foil plated with nickel (T4X-SV manufactured by Fukuda Metal Foil & Powder Co., Ltd., a copper foil including a nickel layer, Rz: 1.1 μm, thickness: 18 μm)

Metal foil 4: a copper foil plated with cobalt (T9FZ-HS manufactured by Fukuda Metal Foil & Powder Co., Ltd., a copper foil including a cobalt barrier layer, Rz: 6.0 μm, thickness: 18 μm)

[Method for Preparing Resin Composition]

Next, a method for preparing the resin composition will be described.

First, components other than a reaction initiator were added to toluene and mixed in a blending ratio shown in Tables 1 and 2 so that a solid content concentration became 60% by mass. The mixture was heated to 80° C., and stirred for 60 minutes while the temperature was kept at 80° C. Thereafter, the mixture that has been stirred was cooled to 40° C., and the reaction initiator was then added at a blending ratio shown in Tables 1 and 2, so that a varnish-like curable composition (varnish) was obtained. The mixture was stirred for 60 minutes to prepare a varnish-like resin composition (varnish).

[Method for Preparing Metal-Clad Laminate]

Next, a glass cloth was impregnated with the obtained varnish, and the resultant was heated and dried at a temperature of 100° C. to 160° C. for about 2 minutes to about 8 minutes, to prepare a prepreg. Specifically, the glass cloth is #2116 or E-glass, all manufactured by Nitto Boseki Co., Ltd. In the impregnation, the content (resin content) of the components such as the polyphenylene ether compound (such as modified polyphenylene ether) and the curing agent, constituting the resin provided by the curing reaction was adjusted to about 50% by mass.

Six prepregs obtained were stacked, and on each of both sides of the stacked body, a barrier layer (cobalt barrier layer or nickel barrier layer) formed by subjecting a metal foil shown in Tables 1 and 2 to a cobalt treatment or a nickel treatment was disposed in contact with the prepreg. Thus, a body to be pressed was obtained. The body to be pressed was hot-pressed under conditions of a temperature of 200° C., a pressure of 3 MPa, and a period of 2 hours, to obtain a metal-clad laminate that had both surfaces each having a metal foil adhered and had a thickness of about 0.8 mm.

Example 2

In Example 2, there is used a metal foil with resin that includes an insulating adhesive layer including no fibrous substrate in place of an insulating layer. Specifically, except that an insulating adhesive layer included no fibrous substrate; a resin composition and a metal foil shown in Table 2 were used; and the insulating adhesive layer was in a semi-cured state before the resin composition was cured, a metal foil with resin was produced in the same manner as in Example 1. When the following evaluation was performed, the metal foil with resin further heated to cure the resin composition (the metal foil with resin including the insulating layer obtained by curing the insulating adhesive layer) was used.

Each of metal-clad laminates or metal foil with resin that was prepared as described above was evaluated by methods described below. Methods for evaluating the metal foil with resin were carried out in the same manner except that the metal foil with resin was used in place of the metal-clad laminate.

[Copper Foil Adhesive Strength]

The metal-clad laminate was measured for peeling strength (copper foil adhesive strength) of the copper foil from the insulating layer in accordance with JIS C 6481. A pattern having a width of 10 mm and a length of 100 mm was formed, and peeled with a tensile testing tester at a rate of 50 mm/min, at which the peeling strength (copper foil adhesive strength) was measured. A unit of measurement is N/mm.

[Deterioration Rate 1 of Copper Foil Adhesive Strength (280° C., 60 minutes)]

The metal-clad laminate was heated at 280° C. for 60 minutes. Thereafter, the metal-clad laminate was measured for the copper foil adhesive strength in the same manner. The change rate of the copper foil adhesive strength before and after the heating was calculated as the deterioration rate 1 (%) of the copper foil adhesive strength.

[Deterioration Rate 2 of Copper Foil Adhesive Strength (85° C., 85% RH, 1000 Hours)]

The metal-clad laminate was heated and humidified under conditions of a temperature of 85° C., a relative humidity of 85% RH, and a period of 1000 hours. Thereafter, the metal-clad laminate was measured for the copper foil adhesive strength in the same manner. The change rate of the copper foil adhesive strength before and after the heating was calculated as the deterioration rate 2 (%) of the copper foil adhesive strength.

[Transmission Loss]

One metal foil of the metal-clad laminate was etched to form straight-line wiring having a width of 160 μm and a length of 1000 mm. A 15 GHz signal was applied to the wiring, and a transmission loss (dB/m) was measured.

The results in the evaluations are shown in Tables 1 and 2.

TABLE 1

| | | | | | Examples | | | | | | | |
|---|---|---|---|---|---|---|---|---|---|---|---|---|
| | | | | | 1 | 2 | 3 | 4 | 5 | 6 | 7 | 8 |
| Resin composition (parts by mass) | Modified PPE | 1 | Intrinsic viscosity | 0.085 | — | — | 56 | 56 | 56 | 56 | 56 | 56 |
| | | | Number of functional groups | 1.8 | | | | | | | | |
| | | 2 | Intrinsic viscosity | 0.09 | 56 | 56 | — | — | — | — | — | — |
| | | | Number of functional groups | 2 | | | | | | | | |
| | | 3 | Intrinsic viscosity | 0.13 | — | — | — | — | — | — | — | — |
| | | | Number of functional groups | 1.8 | | | | | | | | |
| | Thermosetting curing agent | | TAIC | | 24 | 24 | 24 | — | — | 24 | 24 | 24 |
| | | | DVB | | — | — | — | 24 | — | — | — | — |
| | | | TMPT | | — | — | — | — | 24 | — | — | — |
| | Thermoplastic elastomer | | SEPTON V9827 | | 20 | 20 | 20 | 20 | 20 | 20 | 20 | 20 |
| | Reaction initiator | | Perbutyl P | | 1 | 1 | 1 | 1 | 1 | 1 | 1 | 1 |
| | Silane coupling agent | | Methacrylic group | | — | — | — | — | — | 1 | — | 1 |
| | | | Vinyl group | | — | — | — | — | — | — | 1 | — |
| | Inorganic filler | | Silica particles | | 50 | 50 | 50 | 50 | 50 | 50 | 50 | 50 |
| Fibrous substrate | | | | | Present | — | Present | Present | Present | Present | Present | Present |
| Metal foil | Metal foil 1 | | Cobalt | Rz 1.5 μm | Present | Present | Present | Present | Present | Present | Present | Present |
| Evaluation | Copper foil adhesive strength (N/mm) | | | | 0.5 | 0.5 | 0.5 | 0.5 | 0.5 | 0.6 | 0.6 | 0.6 |
| | Deterioration rate 1 of copper foil adhesive strength (%) | | | | 10 | 10 | 5 | 7 | 5 | 5 | 5 | 5 |
| | Deterioration rate 2 of copper foil adhesive strength (%) | | | | 10 | 10 | 5 | 7 | 5 | 5 | 5 | 5 |
| | Transmission loss (dB/m) | | | | −26 | −21 | −26 | −26 | −26 | −26 | −26 | −26 |

| | | | | | Examples | | | | Comparative Examples | | |
|---|---|---|---|---|---|---|---|---|---|---|---|
| | | | | | 9 | 10 | 11 | 12 | 1 | 2 | 3 |
| Resin composition (parts by mass) | Modified PPE | 1 | Intrinsic viscosity | 0.085 | 63 | 56 | 42 | 28 | — | 70 | — |
| | | | Number of functional groups | 1.8 | | | | | | | |
| | | 2 | Intrinsic viscosity | 0.09 | — | — | — | — | 70 | — | — |
| | | | Number of functional groups | 2 | | | | | | | |

TABLE 1-continued

| | | | | | | | | | | | |
|---|---|---|---|---|---|---|---|---|---|---|---|
| | | 3 | Intrinsic viscosity | 0.13 | — | — | — | — | — | — | 56 |
| | | | Number of functional groups | 1.8 | | | | | | | |
| | Thermosetting curing agent | | TAIC | | 27 | 24 | 18 | 12 | 30 | 30 | 24 |
| | | | DVB | | — | — | — | — | — | — | — |
| | | | TMPT | | — | — | — | — | — | — | — |
| | Thermoplastic elastomer | | SEPTON V9827 | | 10 | 20 | 40 | 60 | — | — | 20 |
| | Reaction initiator | | Perbutyl P | | 1 | 1 | 1 | 1 | 1 | 1 | 1 |
| | Silane coupling agent | | Methacrylic group | | 1 | 1 | 1 | 1 | — | 1 | — |
| | | | Vinyl group | | — | — | — | — | — | — | — |
| | Inorganic filler | | Silica particles | | 50 | 50 | 50 | 50 | 50 | 50 | 50 |
| Fibrous substrate | | | | | Present | Present | Present | Present | Present | Present | Present |
| Metal foil | Metal foil 1 | | Cobalt | Rz 1.5 μm | Present | Present | Present | Present | Present | Present | Present |
| Evaluation | Copper foil adhesive strength (N/mm) | | | | 0.7 | 0.6 | 0.6 | 0.6 | 0.5 | 0.6 | 0.5 |
| | Deterioration rate 1 of copper foil adhesive strength (%) | | | | 5 | 5 | 4 | 4 | 20 | 7 | 10 |
| | Deterioration rate 2 of copper foil adhesive strength (%) | | | | 5 | 5 | 4 | 4 | 54 | 19 | 10 |
| | Transmission loss (dB/m) | | | | −27 | −26 | −26 | −25 | −27 | −27 | −27 |

TABLE 2

| | | | | | Examples | | | | | | | | Comparative Examples | |
|---|---|---|---|---|---|---|---|---|---|---|---|---|---|---|
| | | | | | 13 | 14 | 15 | 16 | 17 | 18 | 19 | 20 | 4 | 5 |
| Resin composition (parts by mass) | Modified PPE1 | Intrinsic viscosity | 0.085 | | 56 | 56 | 56 | 56 | 56 | 56 | 56 | 56 | 56 | 56 |
| | | Number of functional groups | 1.8 | | | | | | | | | | | |
| | Thermosetting curing agent | TAIC | | | 24 | 24 | 24 | 24 | 24 | 24 | 24 | 24 | 24 | 24 |
| | Thermoplastic elastomer | SEPTON V9827 | | | 20 | — | — | — | — | — | — | — | 20 | 20 |
| | | SEPTON 2002 | | | — | 20 | — | — | — | — | — | — | — | — |
| | | SEPTON 4033 | | | — | — | 20 | — | — | — | — | — | — | — |
| | | SEPTON 8076 | | | — | — | — | 20 | — | — | — | — | — | — |
| | | Tuftec H1041 | | | — | — | — | — | 20 | — | — | — | — | — |
| | | Tuftec P1500 | | | — | — | — | — | — | 20 | — | — | — | — |
| | | Hybrar 7125 | | | — | — | — | — | — | — | 20 | — | — | — |
| | | Hybrar 5127 | | | — | — | — | — | — | — | — | 20 | — | — |
| | Reaction initiator | Perbutyl P | | | 1 | 1 | 1 | 1 | 1 | 1 | 1 | 1 | 1 | 1 |
| | Silane coupling agent | Methacrylic group | | | 1 | 1 | 1 | 1 | 1 | 1 | 1 | 1 | 1 | 1 |
| | Inorganic filler | Silica particles | | | 50 | 50 | 50 | 50 | 50 | 50 | 50 | 50 | 50 | 50 |
| Fibrous substrate | | | | | Present | Present | Present | Present | Present | Present | Present | Present | Present | Present |
| Metal foil | Metal foil 1 | Cobalt | Rz 1.5 μm | | — | Present | Present | Present | Present | Present | Present | Present | — | — |
| | Metal foil 2 | Cobalt | Rz 1.0 μm | | Present | — | — | — | — | — | — | — | — | — |
| | Metal foil 3 | Nickel | Rz 1.1 μm | | — | — | — | — | — | — | — | — | Present | — |
| | Metal foil 4 | Cobalt | Rz 6.0 μm | | — | — | — | — | — | — | — | — | — | Present |
| Evaluation | Copper foil adhesive strength (N/mm) | | | | 0.6 | 0.6 | 0.6 | 0.6 | 0.6 | 0.6 | 0.6 | 0.6 | 0.6 | 0.7 |
| | Deterioration rate 1 of copper foil adhesive strength (%) | | | | 5 | 5 | 5 | 5 | 5 | 10 | 7 | 10 | 5 | 5 |
| | Deterioration rate 2 of copper foil adhesive strength (%) | | | | 5 | 5 | 5 | 5 | 5 | 10 | 7 | 10 | 5 | 5 |
| | Transmission loss (dB/m) | | | | −25 | −26 | −26 | −26 | −26 | −26 | −26 | −26 | −28 | −34 |

As can be seen from Tables 1 and 2, in the cases of the metal-clad laminate (Examples 1 and 3 to 20), the cobalt-containing barrier layer was provided on each of both the surfaces of the insulating layer containing the cured product of the resin composition containing the polyphenylene ether copolymer having an intrinsic viscosity of 0.03 to 0.12 dl/g and 1.5 to 3 terminal functional groups, the thermosetting curing agent having two or more carbon-carbon unsaturated double bonds at its molecular terminal, and the thermoplastic elastomer, and the metal foil in which the ten-point average roughness Rz of the surface in contact with the insulating layer as the surface roughness was 2 μm or less was laminated. Examples 1 and 3 to 20 had higher copper foil adhesive strength, a lower deterioration rate of the copper foil adhesion strength due to heating and humidification (moisture absorption), and a smaller transmission loss (a smaller absolute value of the transmission loss) than those in the cases excluding Examples 1 and 3 to 20 (Comparative Examples 1 to 5). Specifically, Examples 1 and 3 to 20 had a lower deterioration rate of the copper foil adhesive strength due to heating and humidification (moisture absorption), and a smaller transmission loss (a small absolute value of the transmission loss) than those in the cases of containing no thermoplastic elastomer (Comparative Examples 1 and 2) and the case of using the polyphenylene ether copolymer having an intrinsic viscosity of more than 0.12 dl/g and less than 1.5 terminal functional groups (Comparative Example 3). Examples 1 to 19 had a smaller transmission loss (a smaller absolute value of a transmission loss) than that in the case where the barrier layer was made of nickel (Comparative Example 4) and the case where the ten-point average roughness Rz of the surface in contact with the insulating layer as the surface roughness was more than 2 μm (Comparative Example 5). As a result, the following was found. In the cases of the metal-clad laminate (Examples 1 and 3 to 20), the cobalt-containing barrier layer was provided on each of both the surfaces of the insulating layer containing the cured product of the resin composition containing the polyphenylene ether copolymer having an intrinsic viscosity of 0.03 to 0.12 dl/g and 1.5 to 3 terminal functional groups, the thermosetting curing agent having two or more carbon-carbon unsaturated double bonds at its molecular terminal, and the thermoplastic elastomer, and the ten-point average roughness Rz of the surface in contact with the insulating layer as the surface roughness was 2 μm or less. Examples 1 and 3 to 20 provided the metal-clad laminate that had a reduced loss during signal transmission, had a high adhesive force between the metal foil and the insulating layer, and sufficiently suppress a decrease in the adhesive force between the metal foil and the insulating layer due to heating and moisture absorption. The following was found. In case of the metal foil with resin (Example 2), the cobalt-containing barrier layer was provided on each of both the surfaces of the insulating adhesive layer containing the semi-cured product of the resin composition, and the metal foil in which the ten-point average roughness Rz of the surface in contact with the insulating adhesive layer as the surface roughness was 2 μm or less was laminated. The metal foil with resin of Example 2 also had a reduced loss during signal transmission, had a high adhesive force between the metal foil and the insulating layer obtained by curing the insulating adhesive layer, and sufficiently suppressed a decrease in the adhesive force between the metal foil and the insulating layer due to heating and moisture absorption as with the metal-clad laminate (Examples 1 and 3 to 20).

The ratio of the total of the content of the polyphenylene ether copolymer and the content of the thermosetting curing agent to the content of the thermoplastic elastomer was 50:50 to 90:10 at a ratio by mass (Examples 1, 3 to 11, and 13 to 20). The case provided more excellent impregnation property of the resin composition to the fibrous substrate when the prepreg was prepared than that in the case where the mass ratio was 40:60 (Example 12).

This application is based on Japanese Patent Application No. 2017-136218 filed on Jul. 12, 2017, the contents of which are included in the present application.

The present invention has been appropriately and sufficiently explained above by way of embodiments, for the purpose of illustrating the invention. A person skilled in the art should recognize, however, that the embodiments described above can be easily modified and/or improved. Therefore, it is understood that any modified embodiments or improved embodiments conducted by a person skilled in the art are encompassed within the scope as claimed in the appended claims, so long as these modifications and improvements do not depart from the scope of the claims.

INDUSTRIAL APPLICABILITY

The present invention provides a metal-clad laminate, a metal foil with resin, and a wiring board that have a reduced loss during signal transmission, have a high adhesive force between a metal foil and an insulating layer, and sufficiently suppress a decrease in the adhesive force between the metal foil and the insulating layer due to heating and moisture absorption.

The invention claimed is:
1. A metal-clad laminate comprising:
an insulating layer; and
a metal foil being in contact with at least one surface of the insulating layer, wherein:
the insulating layer contains a cured product of a resin composition containing a polyphenylene ether copolymer having an intrinsic viscosity of 0.03 to 0.12 dl/g measured in methylene chloride at 25° C. and having an average of 1.5 to 3 groups represented by following formula (1) or (2) per molecule at its molecular terminal, a thermosetting curing agent having two or more carbon-carbon unsaturated double bonds at its molecular terminal, and a thermoplastic elastomer;
the metal foil includes a metal substrate, and a cobalt-containing barrier layer provided on at least a contact surface of the metal substrate, the contact surface being in contact with the insulating layer; and
the contact surface has a ten-point average roughness Rz of 2 μm or less as a surface roughness,

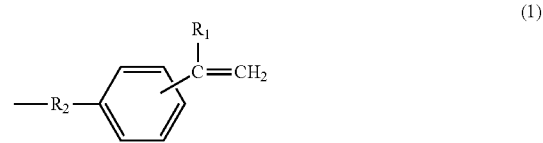

wherein $R_1$ represents a hydrogen atom or an alkyl group having 1 to 10 carbon atoms, and $R_2$ represents an alkylene group having 1 to 10 carbon atoms,

wherein $R_3$ represents a hydrogen atom or an alkyl group having 1 to 10 carbon atoms.

2. The metal-clad laminate according to claim 1, wherein the thermoplastic elastomer contains a styrene-based thermoplastic elastomer.

3. The metal-clad laminate according to claim 2, wherein the styrene-based thermoplastic elastomer contains at least one obtained by hydrogenating all or a part of double bonds selected from the group consisting of a methyl styrene (ethylene/butylene) methyl styrene copolymer, a styrene (ethylene/propylene) styrene copolymer, a styrene (ethylene/butylene) styrene copolymer, a styrene (butadiene/isoprene) styrene copolymer, and a styrene isoprene styrene copolymer.

4. The metal-clad laminate according to claim 2, wherein the styrene-based thermoplastic elastomer contains at least one selected from the group consisting of a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, a hydrogenated styrene (ethylene/propylene) styrene copolymer, and a hydrogenated styrene (ethylene-ethylene/propylene) styrene copolymer.

5. The metal-clad laminate according to claim 1, wherein a ratio of a total of a content of the polyphenylene ether copolymer and a content of the thermosetting curing agent to a content of the thermoplastic elastomer is 50:50 to 90:10 at a ratio by mass.

6. The metal-clad laminate according to claim 1, wherein:
the resin composition further contains a silane coupling agent; and
the silane coupling agent has at least one selected from the group consisting of a vinyl group, a styryl group, a methacrylic group, and an acrylic group in its molecule.

7. The metal-clad laminate according to claim 1, wherein:
a content of the polyphenylene ether copolymer is 30 to 70 parts by mass with respect to a total of 100 parts by mass of the polyphenylene ether copolymer, the thermosetting curing agent, and the thermoplastic elastomer; and
a content of the cured product is 20 to 40 parts by mass with respect to a total of 100 parts by mass of the polyphenylene ether copolymer, the thermosetting curing agent, and the thermoplastic elastomer.

8. A metal foil with resin comprising:
an insulating adhesive layer; and
a metal foil being in contact with at least one surface of the insulating adhesive layer,
wherein:
the insulating adhesive layer contains a resin composition or a semi-cured product of the resin composition, the resin composition containing a polyphenylene ether copolymer having an intrinsic viscosity of 0.03 to 0.12 dl/g measured in methylene chloride at 25° C. and having an average of 1.5 to 3 groups represented by following formula (1) or (2) per molecule at its molecular terminal, a thermosetting curing agent having two or more carbon-carbon unsaturated double bonds at its molecular terminal, and a thermoplastic elastomer;
the metal foil includes a metal substrate, and a cobalt-containing barrier layer provided on at least a contact surface of the metal substrate, the contact surface being in contact with the insulating adhesive layer; and
the contact surface has a ten-point average roughness Rz of 2 μm or less as a surface roughness,

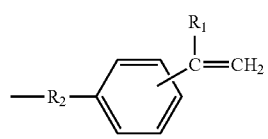
(1)

wherein $R_1$ represents a hydrogen atom or an alkyl group having 1 to 10 carbon atoms, and $R_2$ represents an alkylene group having 1 to 10 carbon atoms,

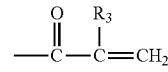
(2)

wherein $R_3$ represents a hydrogen atom or an alkyl group having 1 to 10 carbon atoms.

9. The metal foil with resin according to claim 8, wherein:
a content of the polyphenylene ether copolymer is 30 to 70 parts by mass with respect to a total of 100 parts by mass of the polyphenylene ether copolymer, the thermosetting curing agent, and the thermoplastic elastomer.

10. A wiring board comprising:
an insulating layer; and
wiring being in contact with at least one surface of the insulating layer, wherein:
the insulating layer contains a cured product of a resin composition containing a polyphenylene ether copolymer having an intrinsic viscosity of 0.03 to 0.12 dl/g measured in methylene chloride at 25° C. and having an average of 1.5 to 3 groups represented by following formula (1) or (2) per molecule at its molecular terminal, a thermosetting curing agent having two or more carbon-carbon unsaturated double bonds at its molecular terminal, and a thermoplastic elastomer;
the wiring includes a metal substrate, and a cobalt-containing barrier layer provided on at least a contact surface of the metal substrate, the contact surface being in contact with the insulating layer; and
the contact surface has a ten-point average roughness Rz of 2 μm or less as a surface roughness,

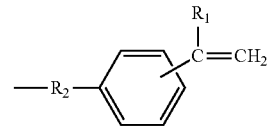
(1)

wherein $R_1$ represents a hydrogen atom or an alkyl group having 1 to 10 carbon atoms, and $R_2$ represents an alkylene group having 1 to 10 carbon atoms,

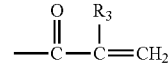
(2)

wherein $R_3$ represents a hydrogen atom or an alkyl group having 1 to 10 carbon atoms.

11. The wiring board according to claim 10, wherein:
a content of the polyphenylene ether copolymer is 30 to 70 parts by mass with respect to a total of 100 parts by mass of the polyphenylene ether copolymer, the thermosetting curing agent, and the thermoplastic elastomer; and
a content of the cured product is 20 to 40 parts by mass with respect to a total of 100 parts by mass of the polyphenylene ether copolymer, the thermosetting curing agent, and the thermoplastic elastomer.

* * * * *